(12) United States Patent
Naba

(10) Patent No.: US 8,916,961 B2
(45) Date of Patent: Dec. 23, 2014

(54) INSULATION SHEET MADE FROM SILICON NITRIDE, AND SEMICONDUCTOR MODULE STRUCTURE USING THE SAME

(75) Inventor: Takayuki Naba, Chigasaki (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 217 days.

(21) Appl. No.: 13/386,735

(22) PCT Filed: Jul. 15, 2010

(86) PCT No.: PCT/JP2010/061976
§ 371 (c)(1),
(2), (4) Date: Jan. 24, 2012

(87) PCT Pub. No.: WO2011/010597
PCT Pub. Date: Jan. 27, 2011

(65) Prior Publication Data
US 2012/0119349 A1    May 17, 2012

(30) Foreign Application Priority Data
Jul. 24, 2009    (JP) .................. 2009-173740

(51) Int. Cl.
| H01L 23/04 | (2006.01) |
| C04B 35/584 | (2006.01) |
| C04B 41/00 | (2006.01) |
| C04B 41/48 | (2006.01) |
| C04B 41/49 | (2006.01) |
| C04B 41/51 | (2006.01) |
| C04B 41/83 | (2006.01) |
| C04B 41/88 | (2006.01) |
| H01L 23/15 | (2006.01) |
| H01L 23/373 | (2006.01) |
| H01L 23/40 | (2006.01) |
| C04B 111/00 | (2006.01) |

(52) U.S. Cl.
CPC ............. C04B 35/584 (2013.01); C04B 41/009 (2013.01); C04B 41/4853 (2013.01);
(Continued)

(58) Field of Classification Search
USPC .................................................. 174/252–255
See application file for complete search history.

(56) References Cited

U.S. PATENT DOCUMENTS 4,118,539 A * 10/1978 Hirai et al. .................... 428/446
5,130,498 A * 7/1992 Yoshida et al. ............... 174/252
(Continued)

FOREIGN PATENT DOCUMENTS

JP     10 4156     1/1998
JP     11 224923   8/1999
(Continued)

OTHER PUBLICATIONS

International Preliminary Report on Patentability and Written Opinion issued Feb. 7, 2012 in patent application No. PCT/JP2010/061976 filed Jul. 15, 2010.

(Continued)

*Primary Examiner* — David Vu
*Assistant Examiner* — Jonathan Han
(74) *Attorney, Agent, or Firm* — Oblon, Spivak, McClelland, Maier & Neustadt, L.L.P.

(57) ABSTRACT

An insulation sheet made from silicon nitride comprising: a sheet-shaped silicon-nitride substrate which contains β-silicon-nitride crystal grains as a main phase; and a surface layer which is formed on one face or both front and back faces of surfaces of the silicon-nitride substrate and is formed from a resin or a metal which includes at least one element selected from among In, Sn, Al, Ag, Au, Cu, Ni, Pb, Pd, Sr, Ce, Fe, Nb, Ta, V and Ti. A semiconductor module structure using the insulation sheet made from silicon nitride.

16 Claims, 4 Drawing Sheets

(52) U.S. Cl.
CPC ......... *C04B 41/4961* (2013.01); *C04B 41/5116* (2013.01); *C04B 41/5127* (2013.01); *C04B 41/515* (2013.01); *C04B 41/5155* (2013.01); *C04B 41/5161* (2013.01); *C04B 41/83* (2013.01); *C04B 41/88* (2013.01); *H01L 23/15* (2013.01); *H01L 23/3735* (2013.01); *H01L 23/4006* (2013.01); *C04B 2111/00844* (2013.01); *C04B 2235/767* (2013.01); *C04B 2235/786* (2013.01); *C04B 2235/788* (2013.01); *C04B 2235/95* (2013.01); *C04B 2235/96* (2013.01); *C04B 2235/9607* (2013.01); *C04B 2235/963* (2013.01)
USPC .................. 257/704; 257/E23.181; 428/141; 428/195.1; 428/336; 428/337; 428/446; 428/450

(56) References Cited

U.S. PATENT DOCUMENTS

| | | | | |
|---|---|---|---|---|
| 5,354,415 | A * | 10/1994 | Fushii et al. | 216/13 |
| 5,686,172 | A * | 11/1997 | Ohya et al. | 156/89.28 |
| 2002/0037435 | A1 * | 3/2002 | Hirashima et al. | 428/693 |
| 2002/0060091 | A1 * | 5/2002 | Naba et al. | 174/257 |
| 2002/0084103 | A1 * | 7/2002 | Komatsu et al. | 174/255 |
| 2002/0164488 | A1 * | 11/2002 | Furo et al. | 428/469 |
| 2005/0214518 | A1 * | 9/2005 | Nagase et al. | 428/210 |

FOREIGN PATENT DOCUMENTS

| | | |
|---|---|---|
| JP | 2002 201075 | 7/2002 |
| JP | 2002 329814 | 11/2002 |
| JP | 2003 63879 | 3/2003 |
| WO | 03 090277 | 10/2003 |

OTHER PUBLICATIONS

International Search Report Issued Aug. 10, 2010 in PCT/JP10/61976 Filed Jul. 15, 2010.

* cited by examiner

INSULATION SHEET MADE FROM SILICON NITRIDE, AND SEMICONDUCTOR MODULE STRUCTURE USING THE SAME

TECHNICAL FIELD

An embodiment according to the present invention relates to an insulation sheet made from silicon nitride and a semiconductor module structure using the same.

BACKGROUND ART

Conventionally, a ceramic metal circuit substrate having an insulation and electrode function has been used in a field of mounting power electronics. The ceramic metal circuit substrate is used as a substrate of a semiconductor module having the insulation and electrode function, for instance, in a semiconductor module structure including a semiconductor module and a radiating member such as a radiation fin. In addition, the semiconductor module structure has been required to have high radiation properties along with the tendency for the power of a semiconductor module to increase in recent years.

In such insulation and electrode fields, a substrate which contains alumina ($Al_2O_3$) or aluminum nitride (AlN) as a main component has been conventionally used as a ceramic substrate.

However, an alumina substrate has the low thermal conductivity of about 18 W/m·K, and accordingly is insufficient in radiation properties. On the other hand, an AlN substrate has the high thermal conductivity of about 200 W/m·K but has low strength, and accordingly is insufficient in heat-cycle resistance characteristics.

Here, the term heat-cycle resistance characteristics means the resistance to the occurrence of a crack which is formed along a peripheral shape of a metal circuit out of ceramic substrate portions of a sample, when the sample of the ceramic metal circuit substrate is produced by forming the metal circuit on a surface of the ceramic substrate, and the sample is subjected to a predetermined heat cycle test.

Thus, it is difficult for a conventional alumina substrate or AlN substrate to satisfy the characteristics of both thermal conductivity and strength. For this reason, a high thermal-conductivity silicon-nitride substrate has been developed as a ceramic material which satisfies the characteristics of both thermal conductivity and strength.

For instance, Japanese Patent Laid-Open No. 2009-120483 (Patent Document 1) describes a high thermal-conductivity metal circuit substrate made from silicon nitride, in which a leakage current is reduced by controlling a diameter of a pore in a grain boundary phase.

The metal circuit substrate made from silicon nitride described in Patent Document 1 is a substrate which has been produced by bonding a copper circuit board to a high thermal-conductivity silicon-nitride substrate through a brazing filler material of an Ag—Cu—Ti-based active metal. Generally, the high thermal-conductivity silicon-nitride substrate contains silicon nitride as its main component, and accordingly a three-point bending strength is as high as 200 MPa or higher. Because of this, the metal circuit substrate made from silicon nitride, which has been produced by bonding the high thermal-conductivity silicon-nitride substrate to the metal circuit board such as a copper plate, has adequate heat-cycle resistance characteristics.

In addition, Japanese Patent Laid-Open No. 2003-192462 (Patent Document 2) discloses that the obtained high thermal-conductivity metal circuit substrate made from silicon nitride can endure a heat-cycle resistance test (TCT test) of 3000 cycles.

However, in order to manufacture the high thermal-conductivity metal circuit substrate made from silicon nitride described in Patent Documents 1 and 2, a bonding process of bonding the high thermal-conductivity silicon-nitride substrate to the metal circuit board is necessary, which needs a high manufacturing cost. Because of this, the high thermal-conductivity metal circuit substrate made from silicon nitride needs a high manufacturing cost.

Then, for the purpose of securing insulation properties of the semiconductor module structure while reducing the manufacturing cost, it has been investigated to use a method in which the high thermal-conductivity silicon-nitride substrate is not bonded to the metal circuit board, in other words, a method which does not produce the high thermal-conductivity metal circuit substrate made from silicon nitride.

For instance, it is proposed to use a high thermal-conductivity silicon-nitride substrate as a spacer for a semiconductor module structure having a pressure contact structure in Japanese Patent Laid-Open No. 2003-197836 (Patent Document 3). It is confirmed that the high thermal-conductivity silicon-nitride substrate according to Patent Document 3 can sufficiently endure as the spacer for the pressure contact structure such as a screw clamp or the like, because the strength and fracture toughness are high.

For information, a silicon-nitride sintered compact which contains a β-silicon-nitride ($Si_3N_4$) crystal as a main phase is generally used as the high thermal-conductivity silicon-nitride substrate. In addition, as the β-$Si_3N_4$ crystal, a crystal grain having a vertically long shape of which the aspect ratio is two or more is usually used. Here, the aspect ratio is a value obtained by dividing a length in a major axis direction of the crystal grain by a length in a minor axis direction of the crystal grain.

The high thermal-conductivity silicon-nitride substrate which contains β-$Si_3N_4$ as a main phase has a microscopic structure in which the β-$Si_3N_4$ grains that have the vertically long shape and have an average grain size, for instance, of about 2 to 10 μm are complicatedly entangled in such a state that the grains face in random directions. The high thermal-conductivity silicon-nitride substrate which contains β-$Si_3N_4$ as the main phase has such a structure, and thereby has high strength and fracture toughness.

When the surface of the high thermal-conductivity silicon-nitride substrate which contains β-$Si_3N_4$ as the main phase is microscopically observed, there exists unevenness on the surface of the silicon-nitride substrate. The unevenness is formed of protrusions that are parts of tips of a large number of complicatedly entangled β-$Si_3N_4$ grains, or the like. The parts of tips forming the protrusions have protruded from the surface of the substrate.

However, it is difficult to eliminate the unevenness even by mirror-polishing the surface to a surface roughness Ra of 0.05 μm or less. In addition, the mirror polishing also becomes a factor in an increase in manufacturing costs of the high thermal-conductivity silicon-nitride substrate, which is not preferable.

Thus, the high thermal-conductivity silicon-nitride substrate having the microscopic unevenness on the surface has such a problem that a crack tends to be easily formed in the silicon-nitride substrate. The crack initiates from the salient when the high thermal-conductivity silicon-nitride substrate is used in such a state that a pressure contact stress is applied onto the microscopic unevenness, particularly onto the salient for a long period of time.

In addition, the high thermal-conductivity silicon-nitride substrate having the microscopic unevenness on the surface produces a microscopic gap between the surface of the high thermal-conductivity silicon-nitride substrate and another member, when a module structure such as a semiconductor module structure having the pressure contact structure is formed by bringing the surface of the high thermal-conductivity silicon-nitride substrate into contact with the another member such as a pressing member. However, the pressing member is generally constituted by a hard material such as a metal, and accordingly, it is difficult to fill the microscopic gap with the material of the member by deforming the shape of the surface of the pressing member side so as to match the unevenness of the surface of the high thermal-conductivity silicon-nitride substrate. For this reason, if the gap is formed between the surface of the high thermal-conductivity silicon-nitride substrate and the pressing member in the module structure having the pressure contact structure, the gap becomes an obstructive factor in thermal conduction and lowers the radiation characteristics of the module structure.

CITATION LIST

Patent Documents

Patent Document 1: Japanese Patent Laid-Open No. 2009-120483
Patent Document 2: Japanese Patent Laid-Open No. 2003-192462
Patent Document 3: Japanese Patent Laid-Open No. 2003-197836

SUMMARY OF THE INVENTION

Problems to be Solved by the Invention

When a module structure having a pressure contact structure is formed by using a conventional high thermal-conductivity silicon-nitride substrate which contains $\beta$-$Si_3N_4$ as a main phase, there has been a problem that a gap is produced between the high thermal-conductivity silicon-nitride substrate and another member such as a pressing member, due to a microscopic unevenness existing on the surface of the high thermal-conductivity silicon-nitride substrate, and the thermal radiation properties of the module structure are lowered.

In addition, when the module structure having the pressure contact structure is formed by using the conventional high thermal-conductivity silicon-nitride substrate which contains $\beta$-$Si_3N_4$ as the main phase, there has been a problem that a crack tends to be easily formed in the silicon-nitride substrate due to the microscopic salient existing on the surface of the high thermal-conductivity silicon-nitride substrate, when the substrate has been subjected to a pressure contact step for producing the module structure.

Incidentally, as a method for avoiding the occurrence of the crack, it is also considered the method which increases the thickness of the high thermal-conductivity silicon-nitride substrate. However, when the high thermal-conductivity silicon-nitride substrate is thickened, the high thermal-conductivity silicon-nitride substrate may become a thermally resistive body, and causes a problem that the thermal radiation properties of the module structure are lowered.

Means for Solving the Problems

The present invention has been made as a result of finding that when a module structure having a pressure contact structure is formed by using an insulation sheet made from silicon nitride having a surface layer of a particular material formed on a surface of a sheet-shaped high thermal-conductivity silicon-nitride substrate which contains $\beta$-silicon-nitride crystal grains as the main phase, while using the high thermal-conductivity silicon-nitride substrate as a spacer or the like and bringing the insulation sheet into contact with a pressing member, accordingly a gap is not easily produced between the high thermal-conductivity silicon-nitride substrate and the pressing member, and a crack does not easily occur in the high thermal-conductivity silicon-nitride substrate.

Specifically, the insulation sheet made from silicon nitride according to a first embodiment of the present invention is an insulation sheet for solving the above described problems. The first embodiment of the present invention is an insulation sheet made from silicon nitride including a sheet-shaped silicon-nitride substrate which contains $\beta$-silicon-nitride crystal grains as a main phase, and a surface layer which is formed on a surface of the silicon-nitride substrate and is formed from a resin or a metal which includes at least one element selected from among In, Sn, Al, Ag, Au, Cu, Ni, Pb, Pd, Sr, Ce, Fe, Nb, Ta, V and Ti.

In addition, the semiconductor module structure according to a second embodiment of the present invention is a structure for solving the above described problems. The second embodiment of the present invention is a semiconductor module structure using the above described insulation sheet made from silicon nitride.

MODES FOR CARRYING OUT THE INVENTION

Insulation Sheet Made from Silicon Nitride

First Embodiment

Figure 1:
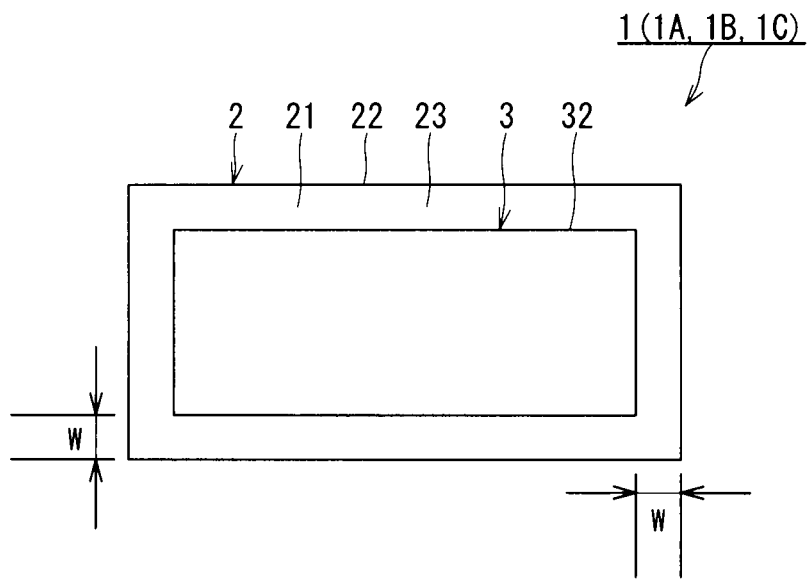
FIG. 1 is a plan view illustrating an insulation sheet made from silicon nitride as a first embodiment according to the present invention.
Figure 2:
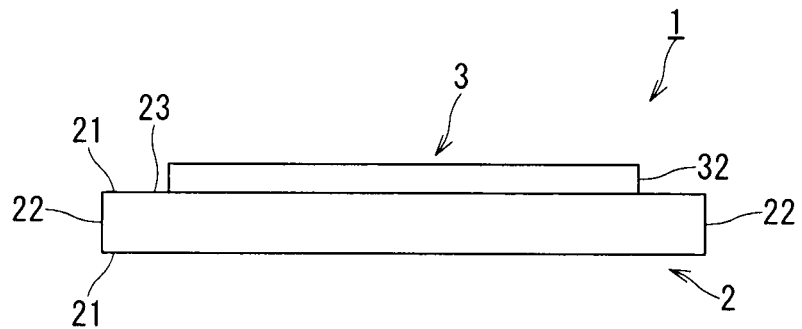
FIG. 2 is a front view of the insulation sheet made from silicon nitride illustrated in FIG. 1.

FIG. 1 is a plan view illustrating an insulation sheet made from silicon nitride as a first embodiment according to the present invention. FIG. 2 is a front view of the insulation sheet made from silicon nitride illustrated in FIG. 1.

As illustrated in FIG. 1 and FIG. 2, an insulation sheet 1 made from silicon nitride illustrated as the first embodiment includes a sheet-shaped silicon-nitride substrate 2, and a surface layer 3 formed on one surface of this silicon-nitride substrate 2.

The surface layer 3 is formed on one part of one surface 21 of the silicon-nitride substrate 2 so that a surface 23 in the vicinity of a peripheral end 22 of the silicon-nitride substrate 2 out of the one surface 21 of the silicon-nitride substrate 2 is exposed to the outside.

<Silicon-Nitride Substrate>

The silicon-nitride substrate 2 is a sheet-shaped silicon-nitride substrate which contains β-silicon-nitride crystal grains as a main phase.

Here, the main phase means a phase having the largest molar ratio in the silicon-nitride substrate 2.

The silicon-nitride substrate includes a silicon-nitride ($Si_3N_4$) crystal grain which occupies the most part of the silicon-nitride substrate by a molar ratio, and a grain boundary phase which occupies the rest of the silicon-nitride substrate by the molar ratio, exists in the grain boundary between the silicon-nitride crystal grains, combines the adjacent silicon-nitride crystal grains with each other, and fills the grain boundary.

In addition, there are generally an α-silicon-nitride crystal grain and a β-silicon-nitride crystal grain in the silicon-nitride crystal grains. In the silicon-nitride substrate of the present embodiment, the abundance ratio of the β-silicon-nitride crystal grain is more than the abundance ratio of the α-silicon-nitride crystal grain, in terms of the abundance ratio by a molar ratio in the silicon-nitride crystal grains.

In the silicon-nitride substrate of the present embodiment, the silicon-nitride crystal grains have a larger molar ratio than the grain boundary phase, and in the silicon-nitride crystal grains, the β-silicon-nitride crystal grain has a larger molar ratio than the α-silicon-nitride crystal grain. For this reason, the silicon-nitride substrate to be used in the present embodiment contains the β-silicon-nitride crystal grain as a main phase.

For information, the α-silicon-nitride crystal grain is not necessarily contained in the silicon-nitride substrate according to the present embodiment in particular. For this reason, all the silicon-nitride crystal grains constituting the silicon-nitride substrate may be the β-silicon-nitride crystal grain.

The grain boundary phase is formed of an oxide containing a rare earth element. The oxide containing the rare earth elements includes $Y_2O_3 \cdot 5Al_2O_3$ (YAG), $Y_2O_3 \cdot Al_2O_3$ (YAL), $2Y_2O_3 \cdot Al_2O_3$ (YAM) and $Y_2O_3$, for instance, when yttrium has been employed.

The silicon-nitride crystal grains in the silicon-nitride substrate normally have an average grain size of 2 to 10 μm. When the average grain size is 2 to 10 μm, the silicon-nitride substrate shows adequate characteristics for a leakage current, thermal conductivity, three-point bending strength, fracture toughness and the like.

The above described average grain size of the silicon-nitride crystal grains means an average grain size of all types of silicon-nitride crystal grains contained in the silicon-nitride substrate. Specifically, when the silicon-nitride substrate contains only the β-silicon-nitride crystal grain as the silicon-nitride crystal grain, the average grain size means the average grain size of the β-silicon-nitride crystal grain. When the silicon-nitride substrate contains the α-silicon-nitride crystal grain and the β-silicon-nitride crystal grain as the silicon-nitride crystal grain, the average grain size means the average grain size calculated by summing the grain sizes of the α-silicon-nitride crystal grain and the β-silicon-nitride crystal grain.

The average grain size of the silicon-nitride crystal grains means an average grain size of silicon-nitride crystal grains which are observed, for instance, in a fracture cross section of the silicon-nitride substrate. Specifically, the average grain size is a value obtained by determining an individual grain size from the expression of (major axis diameter+minor axis diameter)/2, and determining the average grain size of 200 particles as the average grain size. It is preferable for the measurement of the major axis diameter and the minor axis diameter to use a macrophotograph of the fracture cross section of the silicon-nitride substrate. In addition, when the contrast of the fracture cross section is poor due to the unevenness of the cross section, it is preferable to polish the fracture cross section and measure the major axis diameter and the minor axis diameter by using the macrophotograph of this polished fracture cross section.

The average grain size of the silicon-nitride crystal grains is specifically obtained by taking the macrophotograph of the fracture cross section of the silicon-nitride substrate with an SEM (scanning electron microscope), and measuring the sizes of the silicon-nitride crystal grains existing in a predetermined measurement range in the fracture cross section.

The aspect ratio of the β-silicon-nitride crystal grain in the silicon-nitride substrate is normally 2 or more. When the aspect ratio is 2 or more, the silicon-nitride substrate shows adequate characteristics for a leakage current, thermal conductivity, three-point bending strength, fracture toughness and the like.

In addition, the upper limit of the aspect ratio of the β-silicon-nitride crystal grain is not limited in particular, but normally is 10 or less, and preferably is 5 or less.

Here, the aspect ratio is a ratio of major axis/minor axis of the β-silicon-nitride crystal grain. The aspect ratio can be calculated, for instance, by image-processing the image of the particles observed in an arbitrary cross section of the silicon-nitride substrate.

The thickness of the silicon-nitride substrate is normally 0.8 mm or less, and preferably is 0.6 mm or less. When the silicon-nitride substrate exceeds 0.8 mm, the silicon-nitride substrate itself may become a thermally resistive body, a semiconductor module becomes large, and space-saving properties tend to be lowered.

The thickness of the silicon-nitride substrate is normally 0.2 mm or more, and preferably is 0.3 mm or more. When the thickness of the silicon-nitride substrate is less than 0.2 mm, the strength of the silicon-nitride substrate may be lowered.

The surface roughness Ra of the silicon-nitride substrate is normally 0.2 to 1.5 μm, and preferably is 0.2 to 1.0 μm. When the surface roughness Ra is within the range of 0.2 to 1.5 μm, formation of a gap between the silicon-nitride substrate and the pressing member due to the unevenness of the surface of the silicon-nitride substrate can be suppressed, as well as occurrence of a crack in the silicon-nitride substrate due to the unevenness.

A method for setting the surface roughness Ra of the silicon-nitride substrate at 0.2 to 1.5 μm includes, for instance, a method of using a sintered surface of the silicon-nitride substrate as is, and a method of subjecting the sintered surface of the silicon-nitride substrate to a honing or shot blasting process. Thus, the silicon-nitride substrate having the Ra of 0.2 to 1.5 μm is obtained by using the sintered surface as is or subjecting the sintered surface to the honing or shot blasting process. Accordingly, the silicon-nitride substrate having the Ra of 0.2 to 1.5 μm can be produced without being subjected to a polishing process such as a mirror-polishing process.

In order to alleviate influences of the microscopic unevenness on the surface of the silicon-nitride substrate, the surface of the silicon-nitride substrate may also be subjected to the mirror-polishing process, for instance, with the use of a diamond grindstone, and may acquire the surface roughness Ra of 0.05 μm or less.

However, the silicon-nitride substrate to be used in the present embodiment is a hard material and requires labor for being polished. Accordingly, if the silicon-nitride substrate is subjected to the mirror-polishing process, the manufacturing cost of the silicon-nitride substrate increases. In addition, the silicon-nitride substrate to be used in the present embodiment has a microscopic structure in which needle-shaped $\beta$-$Si_3N_4$ crystal grains of the main phase are entangled. Accordingly, even if the silicon-nitride substrate has been subjected to the mirror-polishing process, it is difficult to completely eliminate the microscopic unevenness, and the effect of the mirror-polishing process is not sufficient.

For this reason, when the silicon-nitride substrate 2 to be used in the present embodiment is solely used without having a surface layer 3 provided on the silicon-nitride substrate 2, for an application in which a strong pressing force is applied on the silicon-nitride substrate 2 such as an application of a component of a module having a pressure contact structure, a crack may occur in the silicon-nitride substrate 2 even if the silicon-nitride substrate 2 has been subjected to the mirror-polishing process.

In contrast to this, the silicon-nitride substrate 2 in the present embodiment has a flexible surface layer 3 provided on its surface as is illustrated in FIG. 1. Accordingly, even when the insulation sheet 1 made from silicon nitride contains a silicon-nitride substrate 2 that has a comparatively high surface roughness without being subjected to the mirror-polishing process, for instance, has an Ra of 0.2 to 1.5 μm, the crack is less likely to occur in the silicon-nitride substrate 2. In other words, because the insulation sheet 1 made from silicon nitride of the present embodiment has the flexible surface layer 3 provided on the surface of the silicon-nitride substrate 2, the surface layer 3 is deformed to follow the uneven shape on the surface of the silicon-nitride substrate 2, even when the insulation sheet 1 made from silicon nitride is used for the application to which the strong pressing force is applied, and accordingly the crack is less likely to occur in the silicon-nitride substrate 2 of the insulation sheet 1 made from silicon nitride.

The silicon-nitride substrate to be used in the present embodiment becomes the one having high insulation properties, high thermal conductivity, high strength and high toughness. Characteristics of the silicon-nitride substrate are not limited in particular, but the silicon-nitride substrate preferably has the following characteristics. Specifically, the silicon-nitride substrate preferably shows a leakage current of 1000 nA or less, a thermal conductivity of 50 W/m·K or more, a three-point bending strength of 200 MPa or more and a fracture toughness of 6 MPa·m$^{1/2}$ or more, when an AC voltage of 1.5 kV and 100 Hz has been applied to the silicon-nitride substrate at a temperature of 25° C. and a humidity of 70%.

In addition, the silicon-nitride substrate further preferably has the following characteristics. Specifically, the silicon-nitride substrate further preferably shows a leakage current of 200 nA or less, a thermal conductivity of 80 W/m·K or more, a three-point bending strength of 600 MPa or more and a fracture toughness of 6.5 MPa·m$^{1/2}$ or more.

The silicon-nitride substrate is obtained, for instance, by mixing a silicon-nitride powder with a sintering aid and sintering the mixed substance. Specifically, the silicon-nitride substrate is obtained with a manufacturing method described in Patent Document 1 (Japanese Patent Laid-Open No. 2009-120483) and the like.

The silicon-nitride powder to be used includes a powder, for instance, formed of a large amount of $\alpha$-$Si_3N_4$ crystal grains and a slight amount of $\beta$-$Si_3N_4$ crystal grains. The sintering aid to be used includes, for instance, an oxide of a rare earth element such as $Y_2O_3$.

For information, substantially all of the $\alpha$-$Si_3N_4$ crystal grains in the silicon-nitride powder which is a raw material are converted into the $\beta$-$Si_3N_4$ crystal when having been sintered, and the converted crystal grows as the $\beta$-$Si_3N_4$ crystal grain. Because of this, the silicon-nitride substrate obtained after having been sintered acquires a structure in which substantially only the $\beta$-$Si_3N_4$ crystal grains are complicatedly entangled.

<Surface Layer>

The surface layer 3 is formed on one face of the surfaces of the silicon-nitride substrate 2 as is illustrated in FIG. 1. Incidentally, in the insulation sheet 1 made from silicon nitride illustrated in FIG. 1 as the first embodiment, the surface layer 3 is formed on one face of the surfaces of the silicon-nitride substrate 2. However, in the insulation sheet made from silicon nitride of the present invention, the surface layer 3 does not need to be formed only on one face of the surfaces of the silicon-nitride substrate 2, but may also be formed on both front and back faces of the surfaces of the silicon-nitride substrate 2. The insulation sheet made from silicon nitride having the surface layer 3 formed on both front and back faces of the surfaces of the silicon-nitride substrate 2 will be described later as a third embodiment.

The surface layer 3 is a layer which is formed from a material having flexibility and covers the surface of the silicon-nitride substrate 2. The surface layer 3 is formed from the material having flexibility, and accordingly can embrace the microscopic unevenness on the surface of the silicon-nitride substrate 2. Because of this, when the insulation sheet 1 made from silicon nitride is pressed to another member such as a pressing member through the surface layer 3, the microscopic unevenness on the surface of the silicon-nitride substrate 2 is embraced by the surface layer 3, and the insulation sheet 1 made from silicon nitride can come in close contact with the another member.

When the insulation sheet 1 made from silicon nitride having the surface layer 3 formed thereon is used, for instance, as a component of a semiconductor module structure having a pressure contact structure, and is brought into pressure contact with the semiconductor module through the pressing member, the insulation sheet 1 made from silicon nitride can come in close contact with the pressing member.

The surface layer is formed from a metal or a resin. In addition, the resin may also contain an additive such as a metal powder and a ceramic powder, as needed.

The metal to be used for the surface layer is a metal containing at least one element selected from among In (indium), Sn (tin), Al (aluminum), Ag (silver), Au (gold), Cu (copper), Ni (nickel), Pb (lead), Pd (palladium), Sr (strontium), Ce (cerium), Fe (iron), Nb (niobium), Ta (tantalum), V (vanadium) and Ti (titanium), and specifically is a single metal of each of these elements or an alloy containing these metals as a main component. Here, the main component means a component having the largest molar ratio among the metals to be used for the surface layer.

When the metal to be used for the surface layer is the above described metals, the silicon-nitride substrate shows adequate characteristics for the leakage current, the thermal conductivity, the three-point bending strength, the fracture toughness and the like.

The metal to be used for the surface layer is preferably a metal containing at least one element selected from among Ti, Zr, Hf, Ta, V and Nb, and specifically is a single metal of each of these elements or an alloy containing these metals as a main component.

When the metal to be used for the surface layer is the above described metals, the silicon-nitride substrate shows more adequate characteristics for the leakage current, the thermal conductivity, the three-point bending strength, the fracture toughness and the like.

The metal to be used for the surface layer is further preferably a metal containing at least one element selected from among Ti, Zr and Hf, and specifically is a single metal of each of these elements or an alloy containing these metals as a main component.

The metal Ti, Zr or Hf reacts with a nitrogen atom on the surface of the silicon-nitride substrate to form an active metal nitride, and firmly bonds the surface layer to the silicon-nitride substrate. Because of this, when the metal to be used for the surface layer is the above described metals, bonding strength between the silicon-nitride substrate and the surface layer increases.

The insulation sheet made from silicon nitride having a metal to be used for the surface layer containing at least one element selected from among Ti, Zr and Hf has a high bonding strength. Therefore, the insulation sheet can show sufficient durability and thermal radiation properties, even when being used for a component of a semiconductor module structure having a pressure contact structure, which is used for an application such as an in-vehicle application under a vibratory environment.

The resin to be used for the surface layer includes, for instance, a silicone resin and an epoxy resin. These resins easily enter into the microscopic unevenness on the surface of the silicon-nitride substrate when being applied onto the surface of the silicon-nitride substrate, which is preferable. Particularly, the silicone resin is preferable because when the silicone resin is cured, the obtained cured substance has high elasticity.

When the surface layer formed from the metal is compared to the surface layer formed from the resin, the surface layer made from the metal is preferable from the viewpoint of thermal radiation properties, and the surface layer formed from the resin is preferable from the viewpoint of insulation properties.

The resin to be used for the surface layer has higher insulation properties than the metal, but has lower thermal conductivity than the metal. For this reason, when the resin is used for the surface layer, it is preferable to add a substance such as a metal powder and a ceramic powder which has high thermal conductivity to the resin and thereby to enhance the thermal conductivity of the surface layer.

The metal powder to be added to the resin of the surface layer includes, for instance, a Cu powder and an Al powder.

In addition, the ceramic powder to be added to the resin of the surface layer includes, for instance, an AlN (aluminum nitride) powder and an $Si_3N_4$ powder. Particularly, the AlN powder is preferable because of having adequate insulation properties and thermal conductivity.

The average grain size of the metal powder or the ceramic powder to be added to the resin of the surface layer is normally ½ or less with respect to the thickness of the surface layer, preferably is ⅕ or less, and further preferably is ¹/₁₂ to ⅕. Here, the average grain size of the metal powder or the ceramic powder is a value measured with a Coulter counter method, and means a median $D_{50}$ of a volume cumulative distribution.

If the average grain size of the metal powder or the ceramic powder exceeds ½ with respect to the thickness of the surface layer, when the insulation sheet made from silicon nitride is used for the component of the semiconductor module structure having the pressure contact structure and is pressure-contacted, the metal powder or the ceramic powder is released from the surface layer or is exposed on the surface of the surface layer. Therefore, the enhancement of adhesiveness based on the surface layer may be hindered.

The content of the metal powder or the ceramic powder in the resin of the surface layer is preferably 20 to 60% by volume.

When the content is less than 20% by volume, the enhancement of the thermal conductivity based on the addition of the metal powder or the ceramic powder may be small. In addition, if the content exceeds 60% by volume, when the insulation sheet made from silicon nitride is used for the component of the semiconductor module structure having the pressure contact structure and is pressure-contacted, the metal powder or the ceramic powder is released from the surface layer or is exposed on the surface of the surface layer. Therefore, the enhancement of adhesiveness based on the surface layer may be hindered.

The Vickers hardness Hv of the surface layer is normally 200 or less, preferably is 100 or less, and further preferably is 50 or less. Here, the Vickers hardness Hv is a value obtained by measuring the hardness according to JIS-Z-2244 (Vickers hardness test—testing method).

In addition, the Vickers hardness Hv of the surface layer is normally 10 or more, preferably is 20 or more, and further preferably is 30 or more.

When the Vickers hardness Hv is 10 or more and 200 or less, the elasticity of the surface layer is moderate, and the surface layer can come in close contact with another member such as the pressing member.

In addition, when the Vickers hardness Hv exceeds 200, the surface layer becomes excessively hard, and the effect of the close contact between the surface layer and the another member such as the pressing member tends to become insufficient.

In addition, when the Vickers hardness Hv is less than 10, the surface layer becomes excessively soft, and when the surface layer is brought into pressure contact with the another member such as the pressing member, it becomes difficult for the surface layer to retain its shape. Because of this, the effect of the close contact between the surface layer and the another member such as the pressing member tends to become insufficient.

The thickness of the surface layer is normally 100 μm or less, preferably is 20 to 80 μm, and further preferably is 20 to 50 μm.

When the thickness of the surface layer is 100 μm or less, the elasticity of the surface layer is moderate, and the surface layer can come in close contact with the another member such as the pressing member.

For information, even when the thickness of the surface layer exceeds 100 μm, the surface layer can come in close contact with the another member. However, even when the thickness exceeds 100 μm, the effect of the close contact is not enhanced compared to the case in which the thickness is 100 μm, which is not economical.

In addition, if the thickness of the surface layer is less than 20 μm, when the microscopic unevenness on the surface of the silicon-nitride substrate is large, the surface layer cannot embrace the unevenness on the surface of the silicon-nitride substrate, and accordingly the uneven shape may remarkably appear on the surface of the surface layer. For instance, when the average grain size of the silicon-nitride crystal grains of the silicon-nitride substrate is as large as 10 μm or more, the unevenness on the surface of the silicon-nitride substrate may exceed 20 μm, and in this case, the uneven shape may remarkably appear on the surface of the surface layer.

In addition, when the average grain size of the silicon-nitride crystal grains of the silicon-nitride substrate is as small as 5 μm or less, the microscopic unevenness on the surface of the silicon-nitride substrate is less likely to exceed 20 μm. For this reason, if the thickness of the surface layer is within 20 to 50 μm, the surface layer shows its sufficient effect.

As described above, the surface layer has moderate flexibility. Because of this, when the insulation sheet made from silicon nitride providing the surface layer is used as a component of the semiconductor module structure having the pressure contact structure, the compressed surface layer occasionally is slightly expanded in a transverse direction.

At this time, when the surface layer is provided on the whole surface of the silicon-nitride substrate, the compressed surface layer is expanded in the transverse direction and protrudes from the peripheral end of the silicon-nitride substrate, and the protruded surface layer produces unnecessary conduction, which may cause an insulation failure of the silicon-nitride substrate.

For instance, when the surface layer 3 is provided on the whole surface 21 of the silicon-nitride substrate 2 in the insulation sheet 1 made from silicon nitride illustrated in FIG. 1, the compressed surface layer 3 is expanded in the transverse direction and a peripheral end 32 of the surface layer 3 protrudes from the peripheral end 22 of the silicon-nitride substrate 2, which may cause the insulation failure of the silicon-nitride substrate 2.

For this reason, the surface layer 3 is provided on the silicon-nitride substrate 2 so as to become smaller than the substrate 2 in such a state that the surface layer 3 is not compressed and receives no load, in order that the peripheral end 32 of the compressed surface layer 3 does not protrude from the peripheral end 22 of the silicon-nitride substrate 2.

Specifically, as is illustrated in FIG. 1, the surface layer 3 is provided on the silicon-nitride substrate 2 so that the peripheral end 32 of the surface layer 3 and the peripheral end 22 of the substrate 2 are separated from each other by a predetermined distance W.

The distance W is normally 0.1 mm or longer, preferably is 1 mm or longer, and further preferably is 1.5 mm or longer.

In addition, the upper limit of the distance W is not limited in particular. However, when the area ratio of the surface layer 3 with respect to the silicon-nitride substrate 2 becomes excessively small, such an effect decreases that the surface layer 3 embraces the microscopic unevenness on the surface of the silicon-nitride substrate 2.

For this reason, it is preferable for the surface layer 3 to have a surface area ratio of 80% or more with respect to the surface area of the surface 21 of the silicon-nitride substrate 2.

<Method for Manufacturing Insulation Sheet Made from Silicon Nitride>

Next, a method for manufacturing an insulation sheet made from silicon nitride will be described.

In the method for manufacturing the insulation sheet made from silicon nitride, firstly, a silicon-nitride substrate is prepared.

The silicon-nitride substrate can be obtained, for instance, with a known sintering method such as a manufacturing method described in Patent Documents 1 to 3. Specifically, the silicon-nitride substrate is obtained by sintering a silicon-nitride powder formed of a large amount of $\alpha$-$Si_3N_4$ crystal grains and a slight amount of $\beta$-$Si_3N_4$ crystal grains together with a sintering aid.

Here, the silicon-nitride substrate to be obtained is adjusted so that the silicon-nitride crystal grains contain a $\beta$-silicon-nitride crystal grain as a main phase, and the average grain size, the thickness and the surface roughness Ra of the silicon-nitride crystal grains satisfy the above described predetermined range.

It is preferable for the surface of the silicon-nitride substrate to be kept clean by a honing process or a shot blasting process. In addition, when having been subjected to the honing process or the shot blasting process, the surface roughness Ra of the surface of the silicon-nitride substrate does not become 0.05 μm or less as in the case when having been subjected to a mirror finish process, and the surface roughness Ra becomes within a range of normally 0.2 to 1.5 μm.

However, the surface of the silicon-nitride substrate may also be subjected to the mirror finish process with the use of a diamond grindstone, as needed.

Next, the surface layer is provided on the surface of the silicon-nitride substrate.

Methods to be used for providing a layer formed from a metal containing at least one element selected from among In, Sn, Al, Ag, Au, Cu, Ni, Pb, Pd, Sr, Ce, Fe, Nb, Ta, V and Ti on the silicon-nitride substrate as the surface layer include, for instance, a method of applying a metal paste onto the surface of the silicon-nitride substrate with a screen printing technique and heat-treating the applied metal paste, and a method of forming a thin film with a sputtering technique, a thermal spray technique or the like.

Here, when the metal of the surface layer is formed of a single metal, it is preferable to use the method of forming the thin film with the sputtering technique, the thermal spraying technique or the like, because the surface layer is easily formed thereby. It is further preferable to use the thermal spraying technique among these techniques of forming the thin film, because a metal film having the thickness of 20 μm or more is easily formed thereby.

In addition, when the metal of the surface layer is formed of an alloy, it is preferable to employ a method of applying a paste formed by mixing two or more metal powders onto the surface of the silicon-nitride substrate with a screen printing technique and heat-treating the applied paste to bond the paste to the surface, because the surface layer is easily formed.

Methods to be used for providing the layer formed from a resin on the surface of the silicon-nitride substrate as the surface layer include, for instance, a method of applying a resin paste onto the surface of the silicon-nitride substrate and drying the applied paste, and a method of stacking a resin film on the surface of the silicon-nitride substrate and thermocompression-bonding the stacked resin films to each other.

Incidentally, the resin has lower thermal conductivity than the metal. Then, in order to enhance the thermal conductivity of the surface layer formed from the resin, a resin paste formed by adding a metal powder or a ceramic powder having high thermal conductivity to the resin may also be used as a resin paste to be applied.

As the method of forming the surface layer 3 so that the peripheral end 32 of the surface layer 3 and the peripheral end 22 of the silicon-nitride substrate 2 can be separated from each other by a predetermined distance W, a method is used which forms a resist coating film in a portion in which the surface layer 3 is not formed out of the surface 21 of the silicon-nitride substrate 2, for instance.

Specifically, in FIG. 1, a method or the like is used which includes forming the resist coating film on the surface 23 in which the surface layer 3 is not formed out of the surface 21 of the silicon-nitride substrate 2, forming the surface layer 3 in a portion other than that where the resist coating film is formed out of the surface 21 of the silicon-nitride substrate 2, and removing the resist coating film by etching the film with a NaOH solution or the like.

Effect of First Embodiment

The insulation sheet 1 made from silicon nitride illustrated as the first embodiment has the surface layer 3 having a predetermined flexibility provided on the surface of the silicon-nitride substrate 2, and accordingly when the insulation sheet 1 made from silicon nitride and the another member such as the pressing member arranged in the surface layer 3 side of the insulation sheet 1 made from silicon nitride are brought into pressure contact with each other, the insulation sheet 1 made from silicon nitride can come in close contact with the another member through the surface layer 3.

In addition, the insulation sheet 1 made from silicon nitride illustrated as the first embodiment enhances thermal conduction between the insulation sheet 1 made from silicon nitride and another member such as the pressing member, because the insulation sheet 1 made from silicon nitride comes in close contact with the another member such as the pressing member.

For this reason, for instance, when the insulation sheet 1 made from silicon nitride is used as a component of a semiconductor module structure having a first pressure contact structure in which the insulation sheet 1 made from silicon nitride, the pressing member and the semiconductor module are stacked in this order, or a semiconductor module structure having a second pressure contact structure in which the pressing member, the insulation sheet 1 made from silicon nitride and the semiconductor module are stacked in this order, thermal radiation characteristics of the semiconductor module structure are enhanced.

Furthermore, the insulation sheet 1 made from silicon nitride illustrated as the first embodiment can suppress the occurrence of a crack in the silicon-nitride substrate 2 originating in the microscopic salients on the surface of the silicon-nitride substrate 2, because the microscopic salients on the surface of the silicon-nitride substrate 2 are embraced by the surface layer 3.

For this reason, for instance, when the insulation sheet 1 made from silicon nitride is used as a component of the semiconductor module structure having the first pressure contact structure in which the insulation sheet 1 made from silicon nitride, the pressing member and the semiconductor module are stacked in this order, or the semiconductor module structure having the second pressure contact structure in which the pressing member, the insulation sheet 1 made from silicon nitride and the semiconductor module are stacked in this order, the occurrence of the crack in the silicon-nitride substrate 2 can be suppressed.

The insulation sheet 1 made from silicon nitride illustrated as the first embodiment has the surface layer 3 directly formed on the surface of the silicon-nitride substrate 2. However, the insulation sheet made from silicon nitride of the present invention may further have a reaction layer provided between the silicon-nitride substrate 2 and the surface layer 3.

Figure 3:
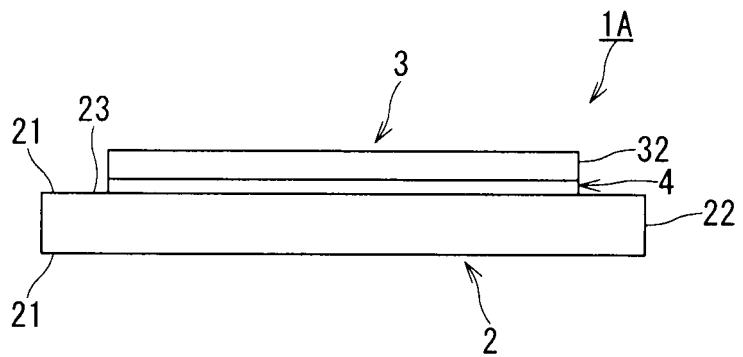
FIG. 3 is a front view illustrating an insulation sheet made from silicon nitride as a second embodiment according to the present invention.

The insulation sheet made from silicon nitride further having the reaction layer provided between the silicon-nitride substrate 2 and the surface layer 3 is illustrated in FIG. 3 as a second embodiment.

Second Embodiment

FIG. 3 is a front view illustrating an insulation sheet made from silicon nitride as a second embodiment according to the present invention.

As is illustrated in FIG. 3, an insulation sheet 1A made from silicon nitride illustrated as the second embodiment includes a sheet-shaped silicon-nitride substrate 2, a reaction layer 4 formed on one surface of this silicon-nitride substrate 2, and a surface layer 3 formed on the surface of this reaction layer 4.

In addition, a plan view of the insulation sheet 1A made from silicon nitride illustrated in FIG. 3 as the second embodiment is the same as that of the insulation sheet 1 made from silicon nitride illustrated in FIG. 1 as the first embodiment, and accordingly is illustrated in FIG. 1 as the same one as the insulation sheet 1 made from silicon nitride.

The insulation sheet 1A made from silicon nitride illustrated in FIG. 3 as the second embodiment is different from the insulation sheet 1 made from silicon nitride illustrated in FIG. 1 and FIG. 2 as the first embodiment, in the point that the insulation sheet 1A further includes the reaction layer 4 between the silicon-nitride substrate 2 and the surface layer 3, and is the same as the insulation sheet 1 in other points. Because of this, the same structure in the insulation sheet 1A made from silicon nitride illustrated in FIG. 3 as the second embodiment as the one in the insulation sheet 1 made from silicon nitride illustrated in FIG. 1 and FIG. 2 as the first embodiment is designated by the same reference numerals, and the descriptions of the structure and the function will be omitted or simplified.

<Reaction Layer>

The reaction layer 4 is formed on one face of the surfaces of the silicon-nitride substrate 2 as is illustrated in FIG. 3. In addition, the insulation sheet 1A made from silicon nitride illustrated in FIG. 3 as the second embodiment has the reaction layer 4 formed on one face of the surfaces of the silicon-nitride substrate 2. However, in the insulation sheet made from silicon nitride of the present invention, the reaction layer 4 does not need to be formed only on one face of the surfaces of the silicon-nitride substrate 2, but may also be formed on both front and back faces of the surfaces of the silicon-nitride substrate 2. The insulation sheet made from silicon nitride having the reaction layer 4 formed on both front and back faces of the surfaces of the silicon-nitride substrate 2 will be described later as a fourth embodiment.

The reaction layer 4 is a layer formed from an active metal nitride which is formed by a reaction of a nitrogen atom of the silicon-nitride substrate 2 with Ti, Zr or Hf of the surface layer 3.

For this reason, the reaction layer 4 is not produced until the surface layer 3 is formed on the surface of the silicon-nitride substrate 2, and only the reaction layer 4 is not solely formed on the surface of the silicon-nitride substrate 2.

The active metal nitride constituting the reaction layer 4 is a brazing filler material. Because of this, the reaction layer 4 strongly bonds the surface layer 3 to the silicon-nitride substrate 2.

The active metal nitride constituting the reaction layer 4 to be used includes, for instance, a nitride containing at least one element selected from among Ti, Zr and Hf.

The reaction layer 4 is a layer adjacent to and has a similar composition to the silicon-nitride substrate 2 or the surface layer 3, and accordingly how to discriminate each layer from other layers becomes a problem. However, the reaction layer 4 is a layer which contains the active metal nitride as a main phase, and the silicon-nitride substrate 2 and the surface layer 3 are layers which do not contain the active metal nitride as the main phase. In this point, the layers can be discriminated.

Effect of Second Embodiment

The insulation sheet 1A made from silicon nitride illustrated as the second embodiment shows a similar effect to that of the insulation sheet 1 made from silicon nitride illustrated as the first embodiment.

In addition, the insulation sheet 1A made from silicon nitride illustrated as the second embodiment has more enhanced bonding strength between the silicon-nitride substrate 2 and the surface layer 3 in comparison with the insulation sheet 1 made from silicon nitride illustrated as the first embodiment because the reaction layer 4 strongly bonds the surface layer 3 to the silicon-nitride substrate 2.

The insulation sheet 1A made from silicon nitride illustrated as the second embodiment has thus high bonding strength. Accordingly, the insulation sheet 1A can show sufficient durability and thermal radiation properties when being used as the component of the semiconductor module structure having the first pressure contact structure in which the insulation sheet 1A made from silicon nitride, the pressing member and the semiconductor module are stacked in this order, or the semiconductor module structure having the second pressure contact structure in which the pressing member, the insulation sheet 1A made from silicon nitride and the semiconductor module are stacked in this order, and even when the semiconductor module structure having the pressure contact structure is used for an application under a vibratory environment such as an in-vehicle application.

Third Embodiment

Figure 4:
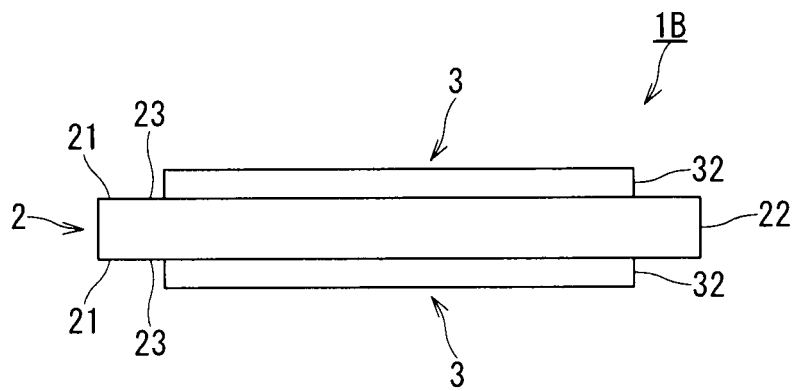
FIG. 4 is a front view illustrating an insulation sheet made from silicon nitride as a third embodiment according to the present invention.

FIG. 4 is a front view illustrating an insulation sheet made from silicon nitride as a third embodiment according to the present invention.

As is illustrated in FIG. 4, an insulation sheet 1B made from silicon nitride illustrated as the third embodiment includes a sheet-shaped silicon-nitride substrate 2, and surface layers 3 and 3 formed on both front and back faces of this silicon-nitride substrate 2.

In addition, a plan view of the insulation sheet 1B made from silicon nitride illustrated in FIG. 4 as the third embodiment is the same as that of the insulation sheet 1 made from silicon nitride illustrated in FIG. 1 as the first embodiment, and accordingly is illustrated in FIG. 1 as the same one as the insulation sheet 1 made from silicon nitride.

The insulation sheet 1B made from silicon nitride illustrated in FIG. 4 as the third embodiment is different from the insulation sheet 1 made from silicon nitride illustrated in FIG. 1 and FIG. 2 as the first embodiment, in the point that the insulation sheet 1B includes the surface layers 3 and 3 on both front and back faces of the silicon-nitride substrate 2, and is the same as the insulation sheet 1 in other points. Because of this, the same structure in the insulation sheet 1B made from silicon nitride illustrated in FIG. 4 as the third embodiment as the one in the insulation sheet 1 made from silicon nitride illustrated in FIG. 1 and FIG. 2 as the first embodiment is designated by the same reference numerals, and the descriptions of the structure and the function will be omitted or simplified.

Effect of Third Embodiment

The insulation sheet 1B made from silicon nitride illustrated as the third embodiment shows a similar effect to that of the insulation sheet 1 made from silicon nitride illustrated as the first embodiment.

In addition, the insulation sheet 1B made from silicon nitride illustrated as the third embodiment can come in close contact with another member through the surface layers 3 in both front and back face sides of the silicon-nitride substrate 2, in comparison with the insulation sheet 1 made from silicon nitride which is illustrated as the first embodiment and has the surface layer 3 formed only on one face of the silicon-nitride substrate 2, because the insulation sheet 1B has the surface layers 3 formed on both front and back faces of the silicon-nitride substrate 2.

Furthermore, the insulation sheet 1B made from silicon nitride illustrated as the third embodiment enhances thermal conduction between the insulation sheet 1B made from silicon nitride and the another member such as the pressing member, in both front and back faces of the silicon-nitride substrate 2.

For this reason, for instance, when the insulation sheet 1B made from silicon nitride is used as a component of the semiconductor module structure having the second pressure contact structure in which the pressing member, the insulation sheet 1B made from silicon nitride and the semiconductor module are stacked in this order, thermal radiation characteristics of the semiconductor module structure are more enhanced than those of the case in which the insulation sheet 1 made from silicon nitride as illustrated as the first embodiment is used.

Furthermore, the insulation sheet 1B made from silicon nitride illustrated as the third embodiment can suppress the occurrence of a crack in the silicon-nitride substrate 2 originating in the microscopic salients on the surface of the silicon-nitride substrate 2, because the microscopic salients on the surfaces of the silicon-nitride substrate 2 are embraced by the surface layers 3 on both front and back faces of the silicon-nitride substrate 2.

For this reason, for instance, when the insulation sheet 1B made from silicon nitride is used as the component of the semiconductor module structure having the second pressure contact structure in which the pressing member, the insulation sheet 1B made from silicon nitride and the semiconductor module are stacked in this order, the occurrence of the crack in the silicon-nitride substrate 2 can be more suppressed than in the case in which the insulation sheet 1 made from silicon nitride illustrated as the first embodiment is used.

Fourth Embodiment

Figure 5:
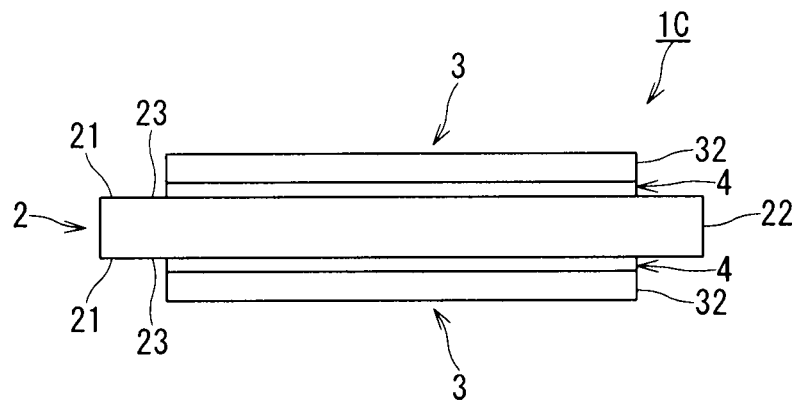
FIG. 5 is a front view illustrating an insulation sheet made from silicon nitride as a fourth embodiment according to the present invention.

FIG. 5 is a front view illustrating an insulation sheet made from silicon nitride as a fourth embodiment according to the present invention.

As is illustrated in FIG. 5, an insulation sheet 1C made from silicon nitride illustrated as the fourth embodiment includes a sheet-shaped silicon-nitride substrate 2, reaction layers 4 and 4 formed on both front and back faces of this silicon-nitride substrate 2, and surface layers 3 and 3 formed on the surfaces of these reaction layers 4 and 4.

In addition, a plan view of the insulation sheet 1C made from silicon nitride illustrated in FIG. 5 as the fourth embodiment is the same as that of the insulation sheet 1 made from silicon nitride illustrated in FIG. 1 as the first embodiment, and accordingly is illustrated in FIG. 1 as the same one as the insulation sheet 1 made from silicon nitride.

The insulation sheet 1C made from silicon nitride illustrated in FIG. 5 as the fourth embodiment is different from the insulation sheet 1A made from silicon nitride illustrated in FIG. 3 as the second embodiment, in the point that the insulation sheet 1C includes the reaction layers 4 and the surface layers 3 on both front and back faces of the silicon-nitride substrate 2, and is the same as the insulation sheet 1A in other points. Because of this, the same structure in the insulation sheet 1C made from silicon nitride illustrated in FIG. 5 as the fourth embodiment as the one in the insulation sheet 1A made from silicon nitride illustrated in FIG. 3 as the second embodiment is designated by the same reference numerals, and the descriptions of the structure and the function will be omitted or simplified.

Effect of Fourth Embodiment

The insulation sheet 1C made from silicon nitride illustrated as the fourth embodiment shows a similar effect to those of the insulation sheet 1 made from silicon nitride illustrated as the first embodiment and the insulation sheet 1A made from silicon nitride illustrated as the second embodiment.

In addition, the insulation sheet 1C made from silicon nitride illustrated as the fourth embodiment can come in close contact with another member through the surface layers 3 on both front and back faces of the silicon-nitride substrate 2, in comparison with the insulation sheet 1A made from silicon nitride which is illustrated as the second embodiment and has the reaction layer 4 and the surface layer 3 formed only on one face of the silicon-nitride substrate 2, because the insulation sheet 1C has the reaction layers 4 and the surface layers 3 formed on both front and back faces of the silicon-nitride substrate 2.

Furthermore, the insulation sheet 1C made from silicon nitride illustrated as the fourth embodiment enhances thermal conduction between the insulation sheet 1C made from silicon nitride and the another member such as the pressing member, in both front and back faces of the silicon-nitride substrate 2.

For this reason, for instance, when the insulation sheet 1C made from silicon nitride is used as the component of the semiconductor module structure having the second pressure contact structure in which the pressing member, the insulation sheet 1C made from silicon nitride and the semiconductor module are stacked in this order, thermal radiation characteristics of the semiconductor module structure are more enhanced than those of the case in which the insulation sheet 1A made from silicon nitride that is illustrated as the second embodiment and has the reaction layer 4 and the surface layer 3 formed only on one face of the silicon-nitride substrate 2 is used.

Furthermore, the insulation sheet 1C made from silicon nitride illustrated as the fourth embodiment can suppress the occurrence of a crack in the silicon-nitride substrate 2 originating in the microscopic salients on the surface of the silicon-nitride substrate 2, because the microscopic salients on the surface of the silicon-nitride substrate 2 are embraced by the surface layers 3 on both front and back faces of the silicon-nitride substrate 2.

For this reason, for instance, when the insulation sheet 1C made from silicon nitride is used as the component of the semiconductor module structure having the second pressure contact structure in which the pressing member, the insulation sheet 1C made from silicon nitride and the semiconductor module are stacked in this order, the occurrence of the crack in the silicon-nitride substrate 2 can be more suppressed than in the case in which the insulation sheet 1A made from silicon nitride that is illustrated as the second embodiment and has the reaction layer 4 and the surface layer 3 formed only on one face of the silicon-nitride substrate 2 is used.

Fifth Embodiment

Figure 6:
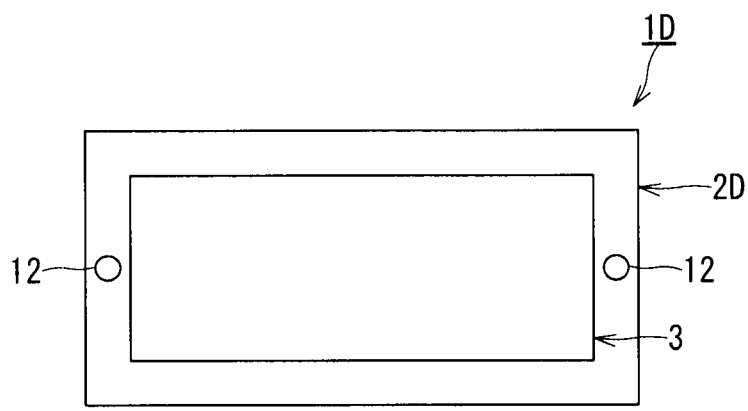
FIG. 6 is a plan view illustrating an insulation sheet made from silicon nitride as a fifth embodiment according to the present invention.

FIG. 6 is a front view illustrating an insulation sheet made from silicon nitride as a fifth embodiment according to the present invention.

As is illustrated in FIG. 6, an insulation sheet 1D made from silicon nitride illustrated as the fifth embodiment includes a sheet-shaped silicon-nitride substrate 2 which has insertion holes 12 that penetrate both front and back faces of the silicon-nitride substrate 2 at two locations, and a surface layer 3 formed on one surface of this silicon-nitride substrate 2.

The insulation sheet 1D made from silicon nitride illustrated in FIG. 6 as the fifth embodiment is different from the insulation sheet 1 made from silicon nitride illustrated in FIG. 1 and FIG. 2 as the first embodiment, in the point that the insulation sheet 1D uses a silicon-nitride substrate 2D which has further insertion holes 12 and 12 provided therein, in place of the silicon-nitride substrate 2, and is the same as the insulation sheet 1 in other points. Because of this, the same structure in the insulation sheet 1D made from silicon nitride illustrated in FIG. 6 as the fifth embodiment as the one in the insulation sheet 1 made from silicon nitride illustrated in FIG. 1 and FIG. 2 as the first embodiment is designated by the same reference numerals, and the descriptions of the structure and the function will be omitted or simplified.

<Silicon-Nitride Substrate>

The silicon-nitride substrate 2D has two insertion holes 12 which penetrate both front and back faces of the silicon-nitride substrate 2D, and are provided in each of shorter sides that oppose to each other in the rectangular silicon-nitride substrate 2D.

The insertion hole 12 may be a hole through which an unshown fastening member such as a screw can be inserted or can be threadably engaged, and the shape and the size are not limited in particular.

In addition, the position and the number of the insertion holes 12 to be provided in the silicon-nitride substrate 2D are also not limited in particular.

The silicon-nitride substrate 2D has the same structure as that of the silicon-nitride substrate 2 constituting the insulation sheet 1 made from silicon nitride illustrated in FIG. 1 and FIG. 2 as the first embodiment, except that the silicon-nitride substrate 2D has the insertion holes 12 therein, and accordingly descriptions concerning the silicon-nitride substrate 2D other than the insertion holes 12 will be omitted.

Effect of Fifth Embodiment

The insulation sheet 1D made from silicon nitride illustrated as the fifth embodiment shows a similar effect to that of the insulation sheet 1 made from silicon nitride illustrated as the first embodiment.

In addition, the insulation sheet 1D made from silicon nitride illustrated as the fifth embodiment has the insertion hole 12 provided in the silicon-nitride substrate 2D. Because of this, the insulation sheet 1D made from silicon nitride is more strongly and surely brought into pressure contact with another member such as the pressing member, by arranging the another member such as the pressing member and a semiconductor module between a thermal radiating member, for instance, which is arranged so as to oppose to the insulation sheet 1D made from silicon nitride and has a hole that can be threadably engaged provided therein, and the insulation sheet 1D made from silicon nitride, and fastening the fastening member such as the screw which has been inserted in or has been threadably engaged with the insertion hole 12 of the insulation sheet 1D made from silicon nitride to the hole of the thermal radiating member, in comparison with the case in which the insulation sheet 1 made from silicon nitride that is illustrated as the first embodiment and does not have the insertion hole 12 provided therein is used.

Accordingly, the insulation sheet 1D made from silicon nitride illustrated as the fifth embodiment can more strongly and surely come in close contact with the another member through the surface layer 3, in comparison with the insulation sheet 1 made from silicon nitride illustrated as the first embodiment.

In addition, the insulation sheet 1D made from silicon nitride illustrated as the fifth embodiment can strongly and surely come in close contact with the another member such as the pressing member, and accordingly can further enhance thermal conduction between the insulation sheet 1D made from silicon nitride and the another member such as the pressing member, in comparison with the case in which the insulation sheet 1 made from silicon nitride illustrated as the first embodiment is used.

For this reason, for instance, when the insulation sheet 1D made from silicon nitride is used as a component of a semiconductor module structure having a first pressure contact structure in which the insulation sheet 1D made from silicon nitride, the pressing member and the semiconductor module are stacked in this order, or a semiconductor module structure having a second pressure contact structure in which the pressing member, the insulation sheet 1D made from silicon nitride and the semiconductor module are stacked in this order, thermal radiation characteristics of the semiconductor module structure are enhanced in comparison with the case in which the insulation sheet 1 made from silicon nitride illustrated as the first embodiment is used.

For information, in the above described insulation sheets made from silicon nitride illustrated as the first embodiment to the fifth embodiment, a sheet-shaped silicon-nitride substrate which contains β-silicon-nitride crystal grains as a main phase has been used as the silicon-nitride substrate.

However, if a sheet-shaped silicon-nitride substrate is used in place of the silicon-nitride substrate which contains the β-silicon-nitride crystal grains as the main phase, the insulation sheet made from silicon nitride of the present invention can also have a structure which includes this sheet-shaped silicon-nitride substrate and a surface layer having Vickers hardness of 200 or less.

According to this insulation sheet made from silicon nitride, the flexibility of the composition of the silicon-nitride substrate is enhanced.

In addition, as for the insulation sheet made from silicon nitride of the present invention, it is preferable that a plate-shaped pressing member be arranged in the surface layer side of the insulation sheet, the semiconductor module be arranged in the back face side of this pressing member, and the surface layer of the insulation sheet press the pressing member while coming in close contact with the pressing member and bring this pressing member into pressure contact with the semiconductor module.

[Semiconductor Module Structure]

The semiconductor module structure according to the present invention employs the insulation sheet made from silicon nitride according to the present invention.

Specifically, the semiconductor module structure according to the present invention includes an insulation sheet made from silicon nitride, and a plate-shaped pressing member which is arranged so as to face the surface layer of the insulation sheet made from silicon nitride, wherein the insulation sheet made from silicon nitride is brought into pressure contact with the pressing member through the surface layer of the insulation sheet made from silicon nitride.

The embodiment of the semiconductor module structure will be described below.

Sixth Embodiment

Figure 7:
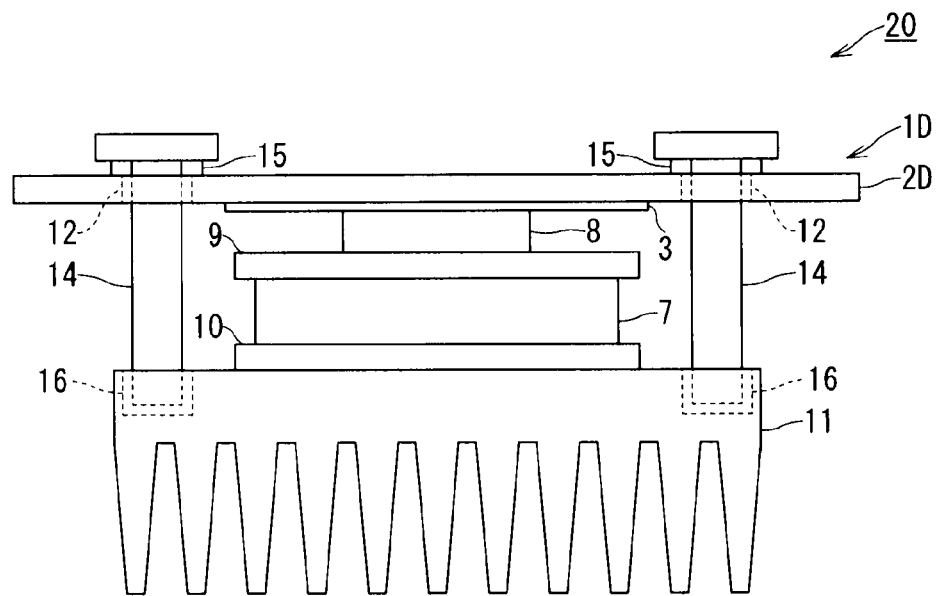
FIG. 7 is a view illustrating a semiconductor module structure as a sixth embodiment according to the present invention.

FIG. 7 is a front view illustrating a semiconductor module structure as a sixth embodiment according to the present invention.

As is illustrated in FIG. 7, a semiconductor module structure 20 illustrated as the sixth embodiment includes: an insulation sheet 1D made from silicon nitride having insertion holes 12 and 12 provided therein; a plate-shaped pressing member 8 arranged so as to face a surface layer 3 of the insulation sheet 1D made from silicon nitride; a semiconductor module 7 arranged on the surface side opposite to the insulation sheet 1 made from silicon nitride out of the surfaces of the pressing member 8; a thermal radiating member 11 which is arranged on the surface side opposite to the pressing member 8 out of the surfaces of the semiconductor module 7 and radiates heat generated in the semiconductor module 7; and a fastening member 14 which fastens the insulation sheet 1D made from silicon nitride and the radiating member 11 to each other.

A plate-shaped insulative spacer 9 is placed between one surface of the semiconductor module 7 and the pressing member 8. In addition, a plate-shaped insulative spacer 10 is placed between the other surface of the semiconductor module 7 and the radiating member 11.

The semiconductor module 7 is sandwiched by the insulative spacer 9 and the insulative spacer 10. In addition, the insulative spacer 9, the semiconductor module 7 and the insulative spacer 10 are sandwiched by the pressing member 8 arranged so as to face the insulative spacer 9, and the thermal radiating member 11 arranged so as to face the insulative spacer 10.

The insulation sheet 1D made from silicon nitride and the thermal radiating member 11 are fastened to each other by using the fastening member 14.

In the semiconductor module structure 20, the insulation sheet 1D made from silicon nitride and the thermal radiating member 11 are fastened to each other by using the fastening member 14, and thereby the pressing member 8, the insulative spacer 9, the semiconductor module 7 and the insulative spacer 10 arranged between the insulation sheet 1D made from silicon nitride and the thermal radiating member 11 are brought into pressure contact with each other.

<Insulation Sheet Made from Silicon Nitride>

The insulation sheet 1D made from silicon nitride is the same one as the insulation sheet made from silicon nitride illustrated in FIG. 6 as the fifth embodiment. The silicon-nitride substrate 2D of the insulation sheet 1D made from silicon nitride has the insertion holes 12 and 12 through which the fastening members 14 can be inserted.

<Pressing Member>

The pressing member 8 is a plate-shaped member which comes in contact with the surface layer 3 of the insulation sheet 1D made from silicon nitride. The pressing member 8 to be used includes, for instance, a metal plate such as a copper plate.

The pressing member 8 is placed between the insulation sheet 1D made from silicon nitride and another member such as the insulative spacer 9. The pressing member 8 is brought into pressure contact with the semiconductor module 7 through the insulative spacer 9, by fastening the insulation sheet 1D made from silicon nitride and the thermal radiating member 11 to each other by using the fastening member 14.

<Semiconductor Module>

The semiconductor module 7 is a single body of a semiconductor element or an aggregate containing the semiconductor element.

The insulative spacers 9 and 10 are arranged respectively in the upper and lower directions of the semiconductor module 7. The insulative spacers 9 and 10 to be used include, for instance, a plate-shaped insulator such as a ceramic substrate.

In the semiconductor module structure 20, the insulation sheet 1D made from silicon nitride and the thermal radiating member 11 are fastened to each other by using the fastening member 14, and thereby the semiconductor module 7 arranged between the insulation sheet 1D made from silicon nitride and the radiating member 11 is sandwiched by the insulative spacer 9 and the insulative spacer 10 and is pressure-contacted.

<Thermal Radiating Member>

The thermal radiating member 11 is a member which radiates the heat generated in the semiconductor module 7.

In the upper portion in the figure of the thermal radiating member 11, a hole 16 in which the tip part of a screw 14 as the fastening member can be threadably engaged is provided.

The radiating member 11 to be used includes, for instance, a radiation fin.

<Fastening Member>

The fastening member 14 is a member which fastens the insulation sheet 1D made from silicon nitride and the radiating member 11 to each other. The fastening member 14 to be used includes, for instance, a screw.

In the semiconductor module structure 20, the trunk of the screw 14 as the fastening member is inserted through the insertion hole 12 of the insulation sheet 1D made from silicon nitride, the tip part of the screw 14 is also threadably engaged with the hole 16 of the radiating member 11, and thereby the insulation sheet 1D made from silicon nitride and the radiating member 11 are fastened to each other. In addition, a washer 15 is placed between the head of the screw 14 and the insulation sheet 1D made from silicon nitride.

Thereby, in the semiconductor module structure 20, the pressing member 8, the insulative spacer 9, the semiconductor module 7 and the insulative spacer 10, which are arranged between the insulation sheet 1D made from silicon nitride and the thermal radiating member 11, are brought into pressure contact with each other.

Function of Sixth Embodiment

In the semiconductor module structure 20, the insulation sheet 1D made from silicon nitride and the thermal radiating member 11 are fastened to each other by using the fastening member 14, and thereby the pressing member 8, the insulative spacer 9, the semiconductor module 7 and the insulative spacer 10, which are arranged between the insulation sheet 1D made from silicon nitride and the thermal radiating member 11, are brought into pressure contact with each other.

At this time, the surface layer 3 of the insulation sheet 1D made from silicon nitride and the surface of the pressing member 8 are strongly brought into pressure contact with each other. However, the surface layer 3 having the flexibility of the insulation sheet 1D made from silicon nitride embraces the microscopic unevenness of the $\beta$-$Si_3N_4$ crystal grains existing on the surface of the silicon-nitride substrate 2D of the insulation sheet 1D made from silicon nitride, and accordingly the insulation sheet 1D made from silicon nitride can come in close contact with the pressing member 8 through the surface layer 3.

Effect of Sixth Embodiment

In the semiconductor module structure 20 illustrated as the sixth embodiment, the insulation sheet 1D made from silicon nitride and the radiating member 11 are fastened to each other, thereby the insulation sheet 1D made from silicon nitride, the pressing member 8, the insulative spacer 9, the semiconductor module 7, the insulative spacer 10 and the radiating member 11 are brought into pressure contact with each other, and accordingly the insulation sheet 1D made from silicon nitride and the pressing member 8 are brought into close contact with each other through the surface layer 3.

Because the insulation sheet 1D made from silicon nitride and the pressing member 8 are thus brought into close contact with each other, a fine gap which may become a thermally resistive body is not formed between the silicon-nitride substrate 2D of the insulation sheet 1D made from silicon nitride and the pressing member 8.

Because of this, the semiconductor module structure 20 illustrated as the sixth embodiment enhances thermal conduction among the insulation sheet 1D made from silicon nitride, the pressing member 8, the insulative spacer 9, the semiconductor module 7, the insulative spacer 10 and the radiating member 11, while retaining high insulation properties due to the silicon-nitride substrate 2D which contains $\beta$-silicon-nitride crystal grains as a main phase, and enhances thermal radiation characteristics.

In addition, the semiconductor module structure 20 illustrated as the sixth embodiment can suppress the occurrence of a crack in the silicon-nitride substrate 2D originating in the microscopic salients on the surface of the silicon-nitride substrate 2D, because the microscopic salients on the surface of the silicon-nitride substrate 2D are embraced by the surface layer 3.

As described above, in the semiconductor module structure 20 illustrated in FIG. 7 as the sixth embodiment, a semiconductor module structure which employs the insulation sheet 1D made from silicon nitride having the surface layer 3 provided only on one face of the silicon-nitride substrate 2D as the insulation sheet made from silicon nitride is illustrated.

However, the semiconductor module structure according to the present invention can also be a semiconductor module structure which employs an insulation sheet made from silicon nitride having the surface layers 3 and 3 provided on both front and back faces of the silicon-nitride substrate as the insulation sheet made from silicon nitride.

Specifically, this semiconductor module structure can be a semiconductor module structure which includes the insulation sheet made from silicon nitride having surface layers provided on both front and back faces of the insulation sheet made from silicon nitride, a plate-shaped pressing member arranged so as to face the surface layer on one face of the insulation sheet made from silicon nitride, and a semiconductor module arranged so as to face the surface layer on the other face of the insulation sheet made from silicon nitride, wherein the insulation sheet made from silicon nitride and the pressing member are brought into pressure contact with each other through the surface layer on one surface of the insulation sheet made from silicon nitride, and the insulation sheet made from silicon nitride and the semiconductor module are brought into pressure contact with each other through the surface layer on the other surface of the insulation sheet made from silicon nitride.

The embodiment of the semiconductor module structure using the insulation sheet made from silicon nitride having the surface layers provided on both front and back faces of the silicon-nitride substrate will be described below as a seventh embodiment.

Seventh Embodiment

Figure 8:
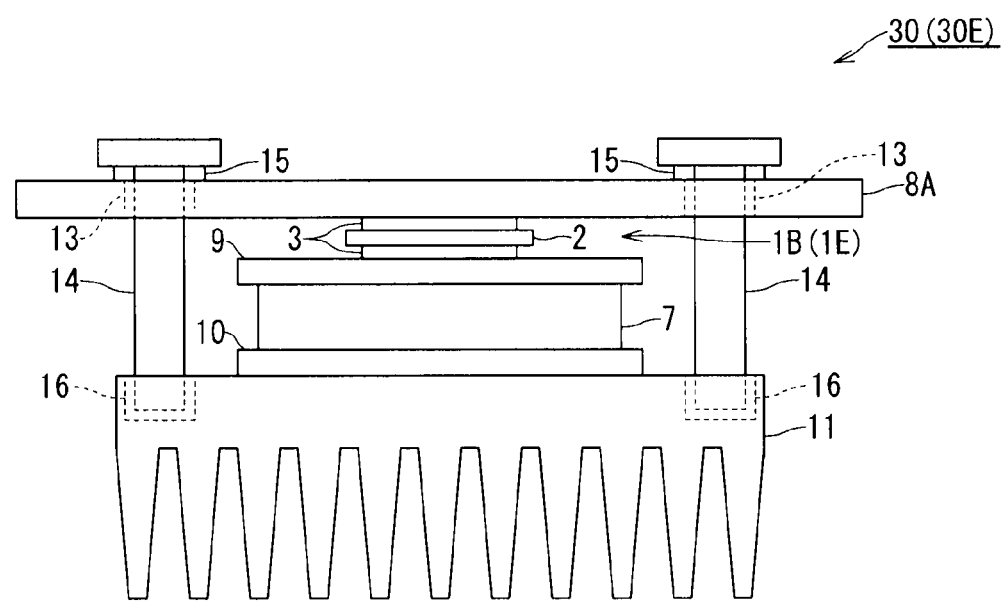
FIG. 8 is a view illustrating a semiconductor module structure as a seventh embodiment according to the present invention.

FIG. 8 is a front view illustrating a semiconductor module structure as a seventh embodiment according to the present invention.

As is illustrated in FIG. 8, a semiconductor module structure 30 illustrated as the seventh embodiment includes: an insulation sheet 1B made from silicon nitride having surface layers 3 and 3 provided on both front and back faces of the insulation sheet 1B made from silicon nitride; a plate-shaped pressing member 8A arranged so as to face the surface layer 3 on one surface of the insulation sheet 1B made from silicon nitride; a semiconductor module 7 arranged so as to face the surface layer 3 on the other surface of the insulation sheet 1B made from silicon nitride; a radiating member 11 which is arranged on the surface side opposite to the insulation sheet 1B made from silicon nitride out of the surfaces of the semiconductor module 7 and radiates heat generated in the semiconductor module 7; and a fastening member 14 which fastens the pressing member 8A and the radiating member 11 to each other.

A plate-shaped insulative spacer 9 is placed between one surface of the semiconductor module 7 and the pressing member 8A. In addition, a plate-shaped insulative spacer 10 is placed between the other surface of the semiconductor module 7 and the thermal radiating member 11.

The semiconductor module 7 is sandwiched by the insulative spacer 9 and the insulative spacer 10. In addition, the insulative spacer 9, the semiconductor module 7 and the insulative spacer 10 are sandwiched by the insulation sheet 1B made from silicon nitride arranged so as to face the insulative spacer 9, and the radiating member 11 arranged so as to face the insulative spacer 10.

The pressing member 8A and the thermal radiating member 11 are fastened to each other by using the fastening member 14.

In the semiconductor module structure 30, the pressing member 8A and the thermal radiating member 11 are fastened to each other by using the fastening member 14, and thereby the insulation sheet 1B made from silicon nitride, the insulative spacer 9, the semiconductor module 7 and the insulative spacer 10, which are arranged between the pressing member 8A and the thermal radiating member 11, are brought into pressure contact with each other.

The semiconductor module structure 30 illustrated in FIG. 8 as the seventh embodiment is different from the semiconductor module structure 20 illustrated in FIG. 7 as the sixth embodiment, in the point that the semiconductor module structure 30 employs a pressing member 8A having an insertion hole 12 provided thereon in place of the insulation sheet 1D made from silicon nitride, and employs the insulation sheet 1B made from silicon nitride having the surface layers 3 provided on both front and back faces of the insulation sheet 1B made from silicon nitride in place of the pressing member 8, and is the same as the semiconductor module structure 20 in other points.

Because of this, the same structure in the semiconductor module structure 30 illustrated in FIG. 8 as the seventh embodiment as the one in the semiconductor module structure 20 illustrated in FIG. 7 as the sixth embodiment is designated by the same reference numerals, and the descriptions of the structure and the function will be omitted or simplified.

<Pressing Member>

The pressing member 8A is a plate-shaped member which comes in contact with one surface layer 3 out of the surface layers 3 and 3 provided on both front and back faces of the insulation sheet 1B made from silicon nitride. The pressing member 8A to be used includes, for instance, a metal plate such as a copper plate, similarly to the pressing member 8.

The pressing member 8A has insertion holes 13 and 13 provided therein through which the fastening member 14 can be inserted.

The shape and the size of the insertion hole 13 are not limited in particular, as long as the fastening member 14 such as a screw can be inserted through or threadably engaged with the insertion hole 13.

In addition, the position and the number of the insertion holes 13 to be provided on the pressing member 8A are also not limited in particular.

The pressing member 8A and the thermal radiating member 11 are fastened to each other by using the fastening member 14, and thereby the pressing member 8A presses another member such as the insulative spacer 9 through the insulation sheet 1B made from silicon nitride.

<Insulation Sheet Made from Silicon Nitride>

The insulation sheet 1B made from silicon nitride is the same one as the insulation sheet made from silicon nitride illustrated in FIG. 4 as the third embodiment. The silicon-nitride substrate 2 of the insulation sheet 1B made from silicon nitride has the surface layers 3 and 3 provided on both front and back faces of the silicon-nitride substrate 2.

The insulation sheet 1B made from silicon nitride is placed between the pressing member 8A and another member such as the insulative spacer 9.

The insulation sheet 1B made from silicon nitride is brought into pressure contact with the semiconductor module 7 through the insulative spacer 9, by fastening the pressing member 8A and the radiating member 11 to each other by using the fastening member 14.

<Fastening Member>

The fastening member 14 is a member which fastens the pressing member 8A and the radiating member 11 to each other. The fastening member 14 to be used includes, for instance, a screw.

In the semiconductor module structure 30, the trunk of a screw 14 as the fastening member is inserted through a washer 15 and the insertion hole 13 of the pressing member 8A, and the tip part of the screw 14 is also threadably engaged with a hole 16 of the thermal radiating member 11. Thereby, the insulation sheet 1B made from silicon nitride and the thermal radiating member 11 are fastened to each other. In addition, the washer 15 is placed between the head of the screw 14 and the pressing member 8A.

Thereby, in the semiconductor module structure 30, the insulation sheet 1B made from silicon nitride, the insulative spacer 9, the semiconductor module 7 and the insulative spacer 10, which are arranged between the pressing member 8A and the thermal radiating member 11, are brought into pressure contact with each other.

Function of Seventh Embodiment

In the semiconductor module structure 30, the pressing member 8A and the radiating member 11 are fastened to each other by using the fastening member 14, and thereby the insulation sheet 1B made from silicon nitride, the insulative spacer 9, the semiconductor module 7 and the insulative spacer 10, which are arranged between the pressing member 8A and the radiating member 11, are brought into pressure contact with each other.

At this time, the surface layer 3 on one surface of the insulation sheet 1B made from silicon nitride and a surface of the pressing member 8A, and the surface layer 3 on the other surface of the insulation sheet 1B made from silicon nitride and a surface of the insulative spacer 9, are strongly brought into pressure contact with each other.

However, the surface layer 3 having flexibility of the insulation sheet 1B made from silicon nitride embraces the microscopic unevenness of the $\beta$-Si$_3$N$_4$ crystal grains existing on the surface of the silicon-nitride substrate 2 of the insulation sheet 1B made from silicon nitride. Accordingly, the insulation sheet 1B made from silicon nitride can come in close contact with the pressing member 8A through the surface layer 3, and the insulation sheet 1B made from silicon nitride can come in close contact with the insulative spacer 9 through the surface layer 3.

Effect of Seventh Embodiment

In the semiconductor module structure 30 illustrated as the seventh embodiment, the pressing member 8A and the radiating member 11 are fastened to each other, thereby the pressing member 8A, the insulation sheet 1B made from silicon nitride, the insulative spacer 9, the semiconductor module 7, the insulative spacer 10 and the thermal radiating member 11 are brought into pressure contact with each other, and accordingly one surface of the insulation sheet 1B made from silicon nitride and the pressing member 8A can come in close contact with each other through the surface layer 3, and the other surface of the insulation sheet 1B made from silicon nitride and the insulative spacer 9 can come in close contact with each other through the surface layer 3.

Because the insulation sheet 1B made from silicon nitride and the pressing member 8A, and the insulation sheet 1B made from silicon nitride and the insulative spacer 9, are thus brought into close contact with each other, a fine gap which may become a thermally resistive body is not formed between the silicon-nitride substrate 2 of the insulation sheet 1B made from silicon nitride and the pressing member 8A and between the insulation sheet 1B made from silicon nitride and the insulative spacer 9.

Because of this, the semiconductor module structure 30 illustrated as the seventh embodiment enhances thermal conduction among the pressing member 8A, the insulation sheet 1B made from silicon nitride, the insulative spacer 9, the semiconductor module 7, the insulative spacer 10 and the radiating member 11, while retaining high insulation properties due to the silicon-nitride substrate 2 which contains $\beta$-silicon-nitride crystal grains as a main phase, and enhances thermal radiation characteristics.

In addition, the semiconductor module structure 30 illustrated as the seventh embodiment can suppress the occurrence of a crack in the silicon-nitride substrate 2 originating in the microscopic salients on the surface of the silicon-nitride substrate 2, because the microscopic salients on the surfaces of the silicon-nitride substrate 2 are embraced by the surface layers 3, similarly to the semiconductor module structure 20 illustrated in FIG. 7 as the sixth embodiment.

Incidentally, in the semiconductor module structure 20 illustrated in FIG. 7 as the sixth embodiment and the semiconductor module structure 30 illustrated in FIG. 8 as the seventh embodiment, an example of using the screw as the fastening member 14 has been illustrated.

However, in the semiconductor module structure according to the present invention, a member which can bring the insulation sheet made from silicon nitride and the pressing member into pressure contact with each other may also be used as a fastening member other than the screw. The fastening member to be used includes, for instance, a clamp which sandwiches the thermal radiating member 11 and the insulation sheet made from silicon nitride, or the thermal radiating member 11 and the pressing member. Thus, when the clamp is used as the fastening member, the insulation sheet made from silicon nitride or the pressing member does not need to have the insertion hole provided therein.

In addition, in the case of the structure in which the pressing member 8A and the thermal radiating member 11 are fastened to each other to form a pressure contact structure as the semiconductor module structure 30 illustrated in FIG. 8 as the seventh embodiment, it is not necessary to provide the insertion hole in the insulation sheet made from silicon nitride.

For this reason, in the semiconductor module structure according to the present invention, the insulation sheet made from silicon nitride according to the present invention can be appropriately used by appropriately selecting the fastening member and selecting the pressure contact structure.

For instance, in the semiconductor module structure 20 illustrated in FIG. 7 as the sixth embodiment and the semiconductor module structure 30 illustrated in FIG. 8 as the seventh embodiment, the above described insulation sheet made from silicon nitride shown in the first embodiment to the fifth embodiment can be used in place of the insulation sheet 1D made from silicon nitride or the insulation sheet 1B made from silicon nitride.

In addition, in the semiconductor module structure 20 illustrated in FIG. 7 as the sixth embodiment and the semiconductor module structure 30 illustrated in FIG. 8 as the seventh embodiment, an example of using a thermal radiation fin as the thermal radiating member 11 has been shown.

However, in the semiconductor module structure according to the present invention, a member which can radiate heat generated from the semiconductor module may also be used as a thermal radiating member other than the thermal radiation fin. For instance, a thermal radiation sheet or the like can be used as the thermal radiating member. In this way, when the thermal radiation sheet is used as the thermal radiating member, the semiconductor module structure having the pressure contact structure can be formed by using a clamp, for instance, as a fastening member, and sandwiching the thermal radiation sheet and the insulation sheet made from silicon nitride, or sandwiching the thermal radiation sheet and the pressing member by the clamp. Then, it becomes unnecessary to provide the insertion hole in the insulation sheet made from silicon nitride and in the pressing member.

In addition, the semiconductor module structure 20 illustrated in FIG. 7 as the sixth embodiment and the semiconductor module structure 30 illustrated in FIG. 8 as the seventh embodiment are examples of the semiconductor module structure according to the present invention. The semiconductor module structure according to the present invention includes all structures which use a semiconductor module and also in which the insulation sheet made from silicon nitride having the surface layer provided thereon and the pressing member can be brought into pressure contact with each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

EXAMPLES

Examples will be described below, but the present invention should not be construed as being limited by these examples.

Examples 1 to 9 and Comparative Example 1

A rectangular plate-shaped silicon-nitride substrate was prepared which showed a thermal conductivity of 90 W/m·K, a three-point bending strength of 720 MPa, a fracture toughness of 6.6 MPa·m$^{1/2}$ and a leakage current (leakage current when AC voltage of 1.5 kV and 100 Hz was applied to the silicon-nitride substrate at a temperature of 25° C. and a humidity of 70%) of 100 nA, and had a length of 50 mm, a width of 30 mm and a thickness of 0.32 mm. In this substrate, all $Si_3N_4$ crystal grains were $\beta$-$Si_3N_4$ crystal grains, the surface of the substrate was adjusted to 0.9 µm. This silicon-nitride substrate was used in Examples 1 to 9 and Comparative Example 1.

Figure 9:
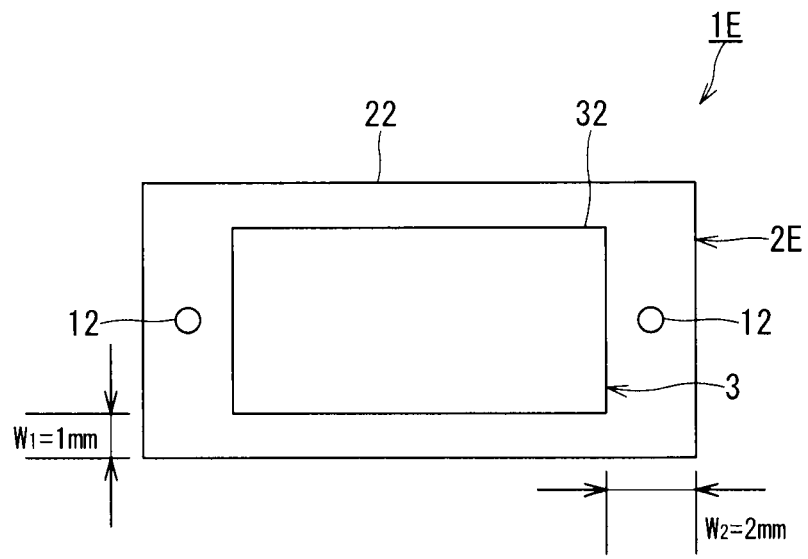
FIG. 9 is a plan view illustrating an insulation sheet made from silicon nitride according to Exemplary embodiments 1 to 9.
Figure 10:
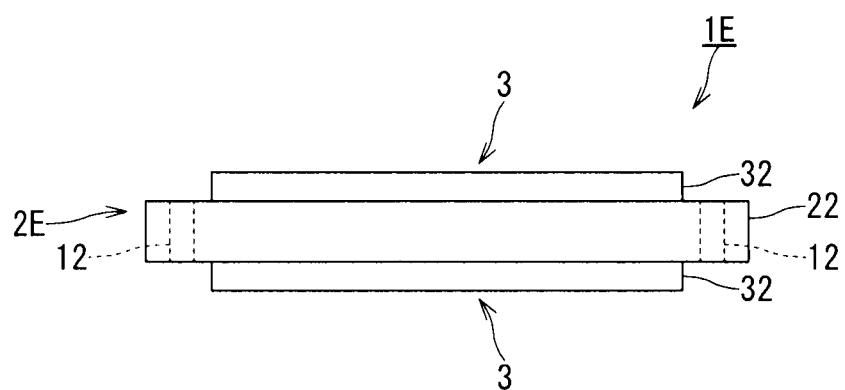
FIG. 10 is a front view of the insulation sheet made from silicon nitride illustrated in FIG. 9.

Next, as is illustrated in FIG. 9 and FIG. 10, a surface layer 3 which was prepared on each condition of Examples 1 to 9 shown in Table 1 was provided on both front and back faces of a silicon-nitride substrate 2E. In addition, the surface layer 3 was formed so that when W was defined as a distance between an end 22 of the silicon-nitride substrate 2E and an end 32 of the surface layer 3, a distance $W_1$ in shorter sides was 1 mm and a distance $W_2$ in longer sides was 2 mm. The surface layers 3 were provided on both front and back faces of the silicon-nitride substrate 2E so that the shape, the thickness, the distance W and the like were equal on both faces of the silicon-nitride substrate 2E.

Furthermore, as is illustrated in FIG. 9 and FIG. 10, insulation sheets 1E made from silicon nitride (Examples 1 to 9) were prepared by providing two screw clamp holes 12 which penetrated both front and back faces of the silicon-nitride substrate 2E and had a diameter of 0.7 mm, in the vicinity of two shorter sides of the silicon-nitride substrate 2E, respectively.

In addition, an insulation sheet made from silicon nitride formed of the silicon-nitride substrate 2E was prepared, which did not have the surface layer 3 provided thereon and had the screw clamp hole 12 provided thereon, and was demonstrated as Comparative Example 1.

TABLE 1

| | Surface Layer | | | |
|---|---|---|---|---|
| Sample No. | Material (mass %) | Method of Forming | Thickness (µm) | Vickers Hardness Hv |
| Example 1 | Paste of Ag(67)—Cu(28)—Ti(5) | Heat Treating the Paste described in Material Column at 850° C. under Vacuum of 1 × 10$^{-4}$ Torr or Less | 75 | 42 |
| Example 2 | Paste of Ag(33)—Cu(33)—Sn(30)—Ti(4) | Heat Treating the Paste described in the Material Column at 850° C. under Vacuum of 1 × 10$^{-4}$ Torr or Less | 60 | 34 |
| Example 3 | Al | Thermal Spray of Al | 60 | 22 |
| Example 4 | In | Thermal Spray of In | 35 | 18 |
| Example 5 | Sn | Thermal Spray of Sn | 40 | 14 |
| Example 6 | Cu | Thermal Spray of Cu | 64 | 27 |
| Example 7 | Paste of Al(95)—Ti(5) | Heat Treating the Paste described in Material Column at 650° C. under Vacuum of 1 × 10$^{-4}$ Torr or Less | 70 | 24 |
| Example 8 | Silicone Resin | Applying and Drying the Paste described in Material Column | 21 | 12 |
| Example 9 | Epoxy Resin | Applying and Drying the Paste described in Material Column | 24 | 13 |
| Comparative Example 1 | — | — | — | — |

$\beta$-$Si_3N_4$ crystal grains were a main phase, the $\beta$-$Si_3N_4$ crystal grains had the aspect ratios of 2 to 10, and the average grain size of the $\beta$-$Si_3N_4$ crystal grains of 3.5 µm. In addition, the surface of the silicon-nitride substrate was subjected to a honing process, and thereby the surface roughness Ra on the Semiconductor module structures 30E (Examples 1 to 9) were prepared by using the insulation sheets made from silicon nitride of Examples 1 to 9, respectively. The semiconductor module structure 30E was a structure in which the insulation sheet 1E made from silicon nitride was used in place of the insulation sheet 1B made from silicon nitride in the semiconductor module structure 30 illustrated in FIG. 8. The semiconductor module structure 30E is illustrated in FIG. 8 in a similar way to that in the semiconductor module structure 30.

In the semiconductor module structure 30E, a torque of a screw clamp between a copper plate 8A as the pressing member and a thermal radiation fin 11 as the thermal radiating member was set at 25 kN.

A semiconductor module structure (Comparative Example 1) was prepared in a similar way to that in Example 1, except that the insulation sheet made from silicon nitride of Comparative Example 1 was used in place of the insulation sheet 1E made from silicon nitride of Example 1.

The thermal radiation properties and durability of the semiconductor module structures of Examples 1 to 9 and Comparative Example 1 were confirmed.

The thermal radiation properties were expressed by a relative ratio of a thermal resistance value of each sample. The thermal resistance value was firstly measured on each sample, then each of the thermal resistance value with respect to the thermal resistance value of Comparative Example 1 that did not have the surface layer provided thereon, is expressed in a manner that the thermal resistance value of Comparative Example was defined to be 100. When the thermal resistance value is less than 100, the value means that the thermal resistance is small.

The durability was measured in the following way. Firstly, the semiconductor module structure was fixed to a vibration tester, and a vibration operation of moving the semiconductor module structure back and forth in the pressure contact direction, specifically in the axial direction of the screw 14, in an interval of 50 cm at a frequency of 500 times per 1 minute, was continuously given to the semiconductor module structure for 100 hours. Next, the surface of the silicon-nitride substrate 2E of the insulation sheet 1E made from silicon nitride after the end of the vibration operation was observed, and it was visually confirmed whether a crack occurred on the surface along the peripheral end 32 of the surface layer 3 out of the surfaces of the silicon-nitride substrate 2E or not.

The results are shown in Table 2.

TABLE 2

| Sample No. | Thermal Radiation Characteristics (Ratio of Thermal Resistance) | Durability (Occurrence of Crack after Vibration Test) |
| --- | --- | --- |
| Example 1 | 90 | not occured |
| Example 2 | 89 | not occured |
| Example 3 | 88 | not occured |
| Example 4 | 91 | not occured |
| Example 5 | 90 | not occured |
| Example 6 | 84 | not occured |
| Example 7 | 87 | not occured |
| Example 8 | 98 | not occured |
| Example 9 | 99 | not occured |
| Comparative Example 1 | 100 | occured |

As understood from Table 2, it was found that the semiconductor module structure using the insulation sheet made from silicon nitride according to the present Examples showed superior thermal radiation properties and durability.

It was also found that in the insulation sheet made from silicon nitride in which Ti which was an active metal had been added into the surface layer 3 (Examples 1, 2 and 7), a reaction layer formed from TiN which was a reactant of Ti with the silicon-nitride substrate was further formed between the silicon-nitride substrate 2E and the surface layer 3.

Examples 10 to 14 and Comparative Examples 2 to 6

Insulation sheets made from silicon nitride (Examples 10 to 14) were prepared in a similar way to that in Example 1, except that the size and the surface roughness of the silicon-nitride substrates, the material of the surface layers and the like were changed as shown in Table 3, $W_1$ and $W_2$ were set at 1 mm and the screw clamp hole 12 was not provided in the silicon-nitride substrates, and that the silicon-nitride substrates of some examples were subjected to a shot blasting process in place of the honing process. Here, the examples in which the silicon-nitride substrates were subjected to the shot blasting process were Examples 11, 13 and 14. In Examples 10 and 12, the silicon-nitride substrates were subjected to the honing process in a similar way to that in Example 1.

The insulation sheet made from silicon nitride of Examples 10 to 14 had the same structure as the insulation sheet 1E made from silicon nitride of Examples 1 to 9 illustrated in FIG. 9 and FIG. 10, except that the screw clamp hole 12 was not provided in the silicon-nitride substrate and the $W_1$ and $W_2$ were set at 1 mm, and accordingly the schematic representation will be omitted.

Semiconductor module structures (Examples 10 to 14) were prepared by using the insulation sheets made from silicon nitride of Examples 10 to 14, respectively, in a similar way to that in Example 1.

The semiconductor module structures of Examples 10 to 14 had the same structure as the semiconductor module structures 30E of Examples 1 to 9 illustrated in FIG. 8, and accordingly the schematic representation will be omitted.

Furthermore, insulation sheets made from silicon nitride were prepared which did not have the surface layer provided thereon in Examples 10 to 14, and these insulation sheets were demonstrated as Comparative Examples 2 to 6. In addition, semiconductor module structures (Comparative Examples 2 to 6) were prepared by using the insulation sheets made from silicon nitride of Comparative Examples 2 to 6 in a similar way to that in Example 1.

The thermal radiation properties and durability of the semiconductor module structures of Examples 10 to 14 and Comparative Examples 2 to 6 were confirmed in a similar way to that in Example 1.

As for the thermal radiation properties, firstly, the thermal resistance value of each sample was measured. Next, the thermal resistance value of each Example was expressed by a relative ratio with respect to the thermal resistance value of each Comparative Example, which was defined to be 100, on the Examples and Comparative Examples of which the conditions except the presence or absence of the surface layer were similar and correspond to each other (Example 10 and Comparative Example 2, Example 11 and Comparative Example 3, Example 12 and Comparative Example 4, Example 13 and Comparative Example 5, and Example 14 and Comparative Example 6).

The results are shown in Table 4.

TABLE 3

| | Silicon-Nitride Substrate | | | | Surface Layer | | | |
|---|---|---|---|---|---|---|---|---|
| | Size of Substrate | | | Surface Roughness | | | Vickers | |
| | Length × Width × Thickness | | | | | | | |
| Sample No. | Length (mm) | Width (mm) | Thickness (mm) | Ra (µm) | Material (mass %) | Thickness (µm) | Hardness Hv | Method of Forming |
| Example 10 | 40 | 20 | 0.25 | 0.2 | Paste of Ag(38)—Cu(35)—In(24)—Ti(3) | 60 | 40 | Heat Treating the Paste described in Material Column at 850° C. under Vacuum of 1 × 10$^{-4}$ Torr or Less |
| Comparative Example 2 | 40 | 20 | 0.25 | 0.2 | — | — | — | — |
| Example 11 | 40 | 20 | 0.25 | 1.2 | Al | 25 | 52 | Thermal Spray of Al |
| Comparative Example 3 | 40 | 20 | 0.25 | 1.2 | — | — | — | — |
| Example 12 | 40 | 20 | 0.635 | 0.5 | Paste of Al(96)—Ti(4) | 80 | 55 | Heat Treating the Paste described in Material Column at 650° C. under Vacuum of 1 × 10$^{-4}$ Torr or Less |
| Comparative Example 4 | 40 | 20 | 0.635 | 0.5 | — | — | — | — |
| Example 13 | 40 | 20 | 0.635 | 0.8 | Sn | 30 | 37 | Thermal Spray of Sn |
| Comparative Example 5 | 40 | 20 | 0.635 | 0.8 | — | — | — | — |
| Example 14 | 40 | 20 | 0.635 | 1.1 | In | 20 | 36 | Thermal Spray of In |
| Comparative Example 6 | 40 | 20 | 0.635 | 1.1 | — | — | — | — |

TABLE 4

| Sample No. | Thermal Radiation Characteristics (Ratio of Thermal Resistance) | Durability (Occurrence of Crack after Vibration Test) |
|---|---|---|
| Example 10 | 88 | not occured |
| Comparative Example 2 | 100 | occured |
| Example 11 | 85 | not occured |
| Comparative Example 3 | 100 | occured |
| Example 12 | 82 | not occured |
| Comparative Example 4 | 100 | occured |
| Example 13 | 88 | not occured |
| Comparative Example 5 | 100 | occured |
| Example 14 | 87 | not occured |
| Comparative Example 6 | 100 | occured |

As understood from Table 4, it was found that the semiconductor module structure using the insulation sheet made from silicon nitride according to the present Examples showed superior characteristics.

It was also found that in the insulation sheet made from silicon nitride, in which Ti which was an active metal had been added into the surface layer (Examples 10 and 12), a reaction layer formed from TiN which was a reactant of Ti with the silicon-nitride substrate was further formed between the silicon-nitride substrate and the surface layer.

Examples 15 to 18

Insulation sheets E (Examples 15 and 16) made from silicon nitride as illustrated in FIG. 9 and FIG. 10 were prepared in a similar way to that in Example 8, except that the surface layers were prepared by using a silicone resin paste made of a silicone resin containing an AlN powder shown in Table 5. The surface layer was formed by applying the silicone resin paste containing the AlN powder onto the surface of the silicon-nitride substrate 2E of Example 1, and drying the applied paste.

In addition, insulation sheets E (Examples 17 and 18) made from silicon nitride as illustrated in FIG. 9 and FIG. 10 were prepared in a similar way to that in Example 9, except that the surface layer was prepared by using an epoxy resin containing an Al powder shown in Table 5. The surface layer was formed by applying the epoxy resin paste containing the Al powder onto the surface of the silicon-nitride substrate 2E of Example 1, and drying the applied paste.

The semiconductor module structures 30E (Examples 15 to 18) illustrated in FIG. 8 were prepared by using the insulation sheets E made from silicon nitride of Examples 15 to 18, respectively.

The thermal radiation properties and durability of the semiconductor module structures of Examples 15 to 18 were confirmed in a similar way to that of Example 1.

The results are shown in Table 5.

TABLE 5

| Sample No. | Surface Layer | | | Insulation Sheet made from Silicon Nitride | |
|---|---|---|---|---|---|
| | Material of Resin | Thickness (μm) | Vickers Hardness Hv | Thermal Radiation Characteristics (Ratio of Thermal Resistance) | Durability (Occurrence of Crack after Vibration Test) |
| Example 15 | Silicone Resin containing AlN powder having the Average Grain Size of 2 μm (Content of AlN powder in the Resin is 30 vol %) | 21 | 17 | 92 | not occured |
| Example 16 | Silicone Resin containing AlN powder having the Average Grain Size of 4 μm (Content of AlN powder in the Resin is 50 vol %) | 21 | 20 | 90 | not occured |
| Example 17 | Epoxy Resin containing Al powder having the Average Grain Size of 2 μm (Content of Al powder in the Resin is 20 vol %) | 24 | 18 | 90 | not occured |
| Example 18 | Epoxy Resin containing Al powder having the Average Grain Size of 4 μm (Content of Al powder in the Resin is 60 vol %) | 24 | 23 | 86 | not occured |

As understood from Table 5, it was found that the insulation sheet made from silicon nitride having the surface layer obtained from the resin containing the metal powder or the ceramic powder showed enhanced thermal radiation properties. It was also found that the durability was not lowered by controlling the size of the powder to be contained in the resin to ½ or less of the thickness of the resin layer and further to ⅕ or less thereof.

DESCRIPTION OF SYMBOLS 1, 1A, 1B, 1C, 1D and 1E insulation sheet made from silicon nitride
2, 2D and 2E silicon-nitride substrate
21 surface of silicon-nitride substrate
22 peripheral end of silicon-nitride substrate
23 exposed surface part of silicon-nitride substrate
3 surface layer
32 peripheral end of surface layer
4 reaction layer
7 semiconductor device (semiconductor module)
8 and 8A pressing member
9 and 10 insulative spacer
11 radiation fin
12 insertion hole of insulation sheet made from silicon nitride
13 insertion hole of pressing member
14 screw (fastening member)
15 washer
16 hole
20, 30 and 30E semiconductor module structure

The invention claimed is:

1. An insulation sheet, comprising:
a sheet-shaped silicon-nitride substrate comprising β-silicon-nitride crystal grains as a main phase; and
a surface layer formed on one face or both front and back faces of the silicon-nitride substrate from a resin;
wherein the surface layer has a Vickers hardness of 200 or less and a thickness of 100 gm or less, and
wherein the insulation sheet is suitable for a pressure contact structure in which the insulation sheet is pressed to another member through the surface layer.

2. The insulation sheet of claim 1, wherein the silicon-nitride substrate has a surface roughness Ra of 0.2 to 1.5 μm.

3. The insulation sheet of claim 1, wherein the surface layer is formed on one part of a surface of the silicon-nitride substrate so as to expose a surface in a vicinity of a peripheral end out of the surface of the silicon-nitride substrate to an outside, and so as also to have a peripheral end of the surface layer separated from the peripheral end out of the surface of the silicon-nitride substrate by 1 mm or more.

4. The insulation sheet of claim 1, further comprising:
a reaction layer between the silicon-nitride substrate and the surface layer, the reaction layer comprising at least one element selected from the group consisting of Ti, Zr and Hf.

5. The insulation sheet of claim 1, further comprising:
a plate-shaped pressing member arranged on a surface layer side of the insulation sheet; and
a semiconductor module arranged in a back face side of the pressing member,
wherein the surface layer presses the pressing member and moves the pressing member into pressure contact with the semiconductor module.

6. The insulation sheet of claim 1, wherein the silicon-nitride substrate has a thickness of 0.8 mm or less.

7. The insulation sheet of claim 1, wherein the surface layer has a Vickers hardness Hv of 100 or less.

8. The insulation sheet of claim 1, wherein the surface layer has a Vickers hardness Hv of 50 or less.

9. A semiconductor module structure, comprising the insulation sheet of claim 1.

10. The semiconductor module structure of claim 9, further comprising:
a plate-shaped pressing member arranged so as to face a surface layer of the insulation sheet,
wherein the insulation sheet and the pressing member are brought into pressure contact with each other through the surface layer of the insulation sheet.

11. The semiconductor module structure of claim 9, further comprising:
a plate-shaped pressing member arranged so as to face a surface layer of the insulation sheet;
a semiconductor module arranged on a surface side opposite to the insulation sheet out of surfaces of the pressing member;
a radiating member arranged on a surface side opposite to the pressing member out of surfaces of the semiconductor module, wherein the radiating member radiates heat generated in the semiconductor module; and
a fastening member which fastens the insulation sheet and the radiating member to each other, wherein the insulation sheet and the radiating member are fastened to each other with the fastening member, and thereby the pressing member and the semiconductor module, arranged between the insulation sheet and the radiating member, are brought into pressure contact with each other.

12. The semiconductor module structure of claim 9, comprising:
the insulation sheet comprising surface layers on both front and back faces of the insulation sheet;
a plate-shaped pressing member arranged so as to face the surface layer on one face of the insulation sheet; and
a semiconductor module arranged so as to face the surface layer on another face of the insulation sheet,
wherein the insulation sheet and the pressing member are brought into pressure contact with each other through the surface layer on one surface of the insulation sheet, and the insulation sheet and the semiconductor module are brought into pressure contact with each other through the surface layer on another surface of the insulation sheet.

13. The semiconductor module structure of claim 9, comprising:
the insulation sheet comprising surface layers on both front and back faces of the insulation sheet;
a plate-shaped pressing member arranged so as to face the surface layer on one surface of the insulation sheet;
a semiconductor module arranged so as to face the surface layer on another surface of the insulation sheet;
a radiating member arranged on a surface side opposite to the insulation sheet out of surfaces of the semiconductor module, wherein the radiating member radiates heat generated in the semiconductor module; and
a fastening member which fastens the pressing member and the radiating member to each other,
wherein the pressing member and the radiating member are fastened to each other with the fastening member, and thereby the insulation sheet and the semiconductor module, arranged between the pressing member and the radiating member, are brought into pressure contact with each other.

14. The insulation sheet of claim 1, wherein the silicon-nitride crystal grains in the silicon-nitride substrate have an average grain size of 2 to 10 μm.

15. The insulation sheet of claim 1, wherein the silicon-nitride substrate has a thermal conductivity of 80 W/m·K or more and a three-point bending strength of 600 MPa or more.

16. The insulation sheet of claim 1, wherein the surface layer is formed from a resin comprising a metal powder or a ceramic powder.

* * * * *

UNITED STATES PATENT AND TRADEMARK OFFICE
CERTIFICATE OF CORRECTION

| | |
|---|---|
| PATENT NO. | : 8,916,961 B2 |
| APPLICATION NO. | : 13/386735 |
| DATED | : December 23, 2014 |
| INVENTOR(S) | : Takayuki Naba |

Page 1 of 1

It is certified that error appears in the above-identified patent and that said Letters Patent is hereby corrected as shown below:

In the Claims

In column 33, line 60, claim 1:
"less and a thickness of 100 gm or less, and"
should read as
--less and a thickness of 100 µm or less, and--

Signed and Sealed this
Seventh Day of July, 2015

Michelle K. Lee
*Director of the United States Patent and Trademark Office*